United States Patent
Lee et al.

(10) Patent No.: US 8,692,314 B2
(45) Date of Patent: Apr. 8, 2014

(54) NON-VOLATILE MEMORY DEVICE AND METHOD FOR FABRICATING THE SAME

(71) Applicant: SK hynix Inc., Gyeonggi-do (KR)

(72) Inventors: Ki-Hong Lee, Gyeonggi-do (KR); Moon-Sig Joo, Gyeonggi-do (KR); Kwon Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/725,299

(22) Filed: Dec. 21, 2012

(65) Prior Publication Data

US 2013/0105883 A1    May 2, 2013

Related U.S. Application Data

(62) Division of application No. 12/850,765, filed on Aug. 5, 2010, now Pat. No. 8,349,689.

(30) Foreign Application Priority Data

May 31, 2010    (KR) .................. 10-2010-0051420

(51) Int. Cl.
*H01L 29/792* (2006.01)

(52) U.S. Cl.
USPC .................. 257/324; 257/328; 257/E29.262

(58) Field of Classification Search
USPC .......... 257/315, 316, 324, E29.262, E29.309, 257/328, 329
See application file for complete search history.

(56) References Cited

U.S. PATENT DOCUMENTS

| | | | | |
|---|---|---|---|---|
| 8,178,919 | B2 * | 5/2012 | Fujiwara et al. | 257/324 |
| 2010/0213538 | A1 * | 8/2010 | Fukuzumi et al. | 257/326 |
| 2011/0291177 | A1 * | 12/2011 | Lee et al. | 257/324 |
| 2012/0091521 | A1 * | 4/2012 | Goda | 257/328 |

* cited by examiner

*Primary Examiner* — Tuan N. Quach
(74) *Attorney, Agent, or Firm* — IP & T Group LLP

(57) ABSTRACT

A non-volatile memory device includes a pair of columnar cell channels vertically extending from a substrate, a doped pipe channel arranged to couple lower ends of the pair of columnar cell channels, insulation layers over the substrate in which the doped pipe channel is buried, memory layers arranged to surround side surfaces of the columnar cell channels, and control gate electrodes arranged to surround the memory layers.

9 Claims, 18 Drawing Sheets

NON-VOLATILE MEMORY DEVICE AND METHOD FOR FABRICATING THE SAME

CROSS-REFERENCE TO RELATED APPLICATIONS

This application is a division of U.S. patent application Ser. No. 12/850,765 filed on Aug. 5, 2010. U.S. Pat. No. 8,349,689, which claims priority of Korean Patent Application No. 10-2010-0051420 filed on May 31, 2010. The disclosure of each of the foregoing applications is incorporated herein by reference in its entirety.

BACKGROUND OF THE INVENTION

Exemplary embodiments of the present invention relate to a non-volatile memory device, and more particularly, to a three-dimensional non-volatile memory device and a method for fabricating the same.

In a memory string structure with a U shape of a non-volatile memory device such as a three-dimensional flash memory, a source selection gate and a drain selection gate are formed on a memory string. Such a memory string structure is desirable in terms of device characteristics as compared with a vertical string structure in which selection gates are formed on and under a memory string. order to operate such a U shaped memory string, a transistor for electrically coupling the selection gates to a bottom is used. The transistor is called a pipe channel transistor.

Two strings coupled to each other through a source and a drain are electrically coupled to each other through the pipe channel transistor. In order to electrically couple the two strings to each other, the pipe channel transistor is needed to be turned on.

FIG. 1 is a cross-sectional view illustrating a conventional three-dimensional non-volatile memory device, Referring to FIG. 1, a pipe gate 12 is formed on a bottom substrate 11. The bottom substrate 11 has a structure in which a semiconductor substrate and an insulation layer are stacked. The pipe gate 12 is etched to form a pipe channel hole 12A.

A memory string is formed on the pipe gate 12. The memory string includes a first string MS1 and a second string MS2. The first string MS1 and the second string MS2 include a plurality of memory cells, respectively. The first string MS1 is coupled to the second string MS2 through a pipe channel 17B. The first string MS1 and the second string MS2 include first insulation layers 13 and control gate electrodes 14. The first insulation layer 13 and the control gate electrode 14 are alternately stacked for multiple times. The memory string includes a pair of cell channel holes 15 which are coupled to each other through the pipe channel hole 12A. A substantially U-shaped string structure is formed by the cell channel holes 15 and the pipe channel hole 12A, the plurality of memory cells of the first string MS1 are serially coupled to one another, and the plurality of memory cells of the second string MS2 are serially coupled to one another. A memory layer 16, cell channels 17A and a second insulation layer 19 fill the cell channel holes 15. The memory layer 16, a pipe channel 17B and the second insulation layer 19 fill the pipe channel hole 12A. The memory layer 16 is formed by stacking a blocking layer, a charge trap layer and a tunnel insulation layer. The control gate electrodes 14 of each string are separated from each other by a slit 18 and a third insulation layer 20 fills the slit 18, In FIG. 1, a pipe channel transistor (PC Tr) is formed below the memory string by the pipe gate 12 and the pipe channel 17B. In order to form the pipe gate 12, processes of depositing a polysilicon layer and forming a trench and a sacrificial layer (silicon nitride layer), and a chemical mechanical polishing (CMP) process, and the like may be performed. In the CMP process, a silicon nitride layer CMP process of using a polysilicon layer as a stop layer or a polysilicon CMP process of using a silicon nitride layer as a stop layer may be performed. However, since these CMP processes are difficult to ensure uniformity and reproduction, it may be difficult to apply the CMP processes to mass production.

Furthermore, since it is difficult to use a metal gate as the pipe gate 12 of the pipe channel transistor, an $N^+$ doped polysilicon is used for the pipe gate 12. Use of the metal gate is avoided since a subsequent cell formation process is difficult to perform.

The pipe gate 12 is turned on at the time of a program or read operation. However, when the pipe gate 12 is turned on, the control gate electrodes 14 of the memory string are simultaneously turned on. In such a case, since the resistance of the $N^+$ doped polysilicon is relatively large, speed reduction due to resistive capacitance delay (RC delay) occurs.

SUMMARY OF THE INVENTION

An embodiment of the present invention is directed to provide a three-dimensional non-volatile memory device capable of electrically coupling strings of a memory string to one another without using a pipe channel transistor in a substantially U-shaped string structure, and a method for fabricating the same.

In accordance with an embodiment of the present invention, a non-volatile memory device includes: a pair of columnar cell channels vertically extending from a substrate; a doped pipe channel arranged to couple lower ends of the pair of columnar cell channels; insulation layers over the substrate in which the doped pipe channel is buried; memory layers arranged to surround side surfaces of the columnar cell channels; and control gate electrodes which surround the side surfaces of the memory layers. The columnar cell channel includes an undoped polysilicon layer and the doped pipe channel includes a doped polysilicon layer.

In accordance with another embodiment of the present invention, a method for fabricating a non-volatile memory device includes: forming a multilayer over a substrate, the multilayer including an insulation layer formed with a pipe channel hole and a pair of cell channel holes coupled to the pipe channel hole; forming a pair of columnar cell channels in the cell channel holes, and a pipe channel arranged to electrically couple lower ends of the pair of columnar cell channels to each other; and doping an impurity in the pipe channel.

In accordance with yet another embodiment of the present invention, a method for fabricating a non-volatile memory device includes: forming a multilayer over a substrate, the multilayer including an insulation layer formed with a pipe channel hole and a pair of cell channel holes coupled to the pipe channel hole; forming a pair of columnar cell channels in the cell channel holes, and a pipe channel arranged to electrically couple lower ends of the pair of columnar cell channels to each other; forming a doped layer coupled to the pipe channel and doped with an impurity; and diffusing the impurity.

DESCRIPTION OF SPECIFIC EMBODIMENTS

Figure 1:
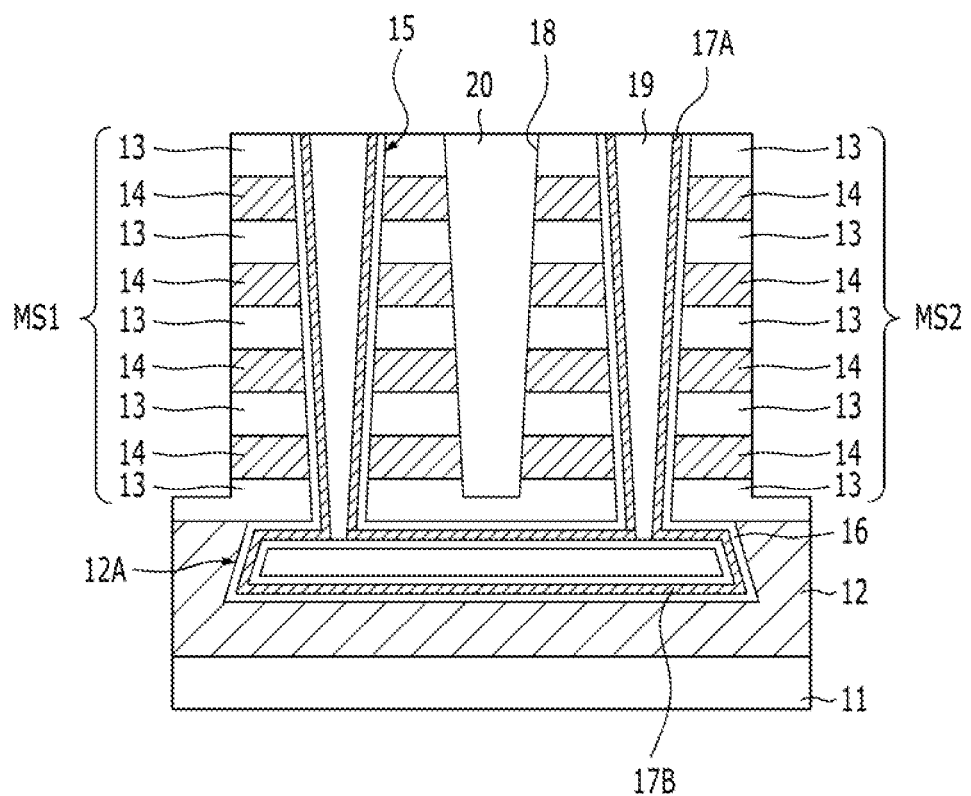
FIG. 1 is a cross-sectional view illustrating a conventional three-dimensional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
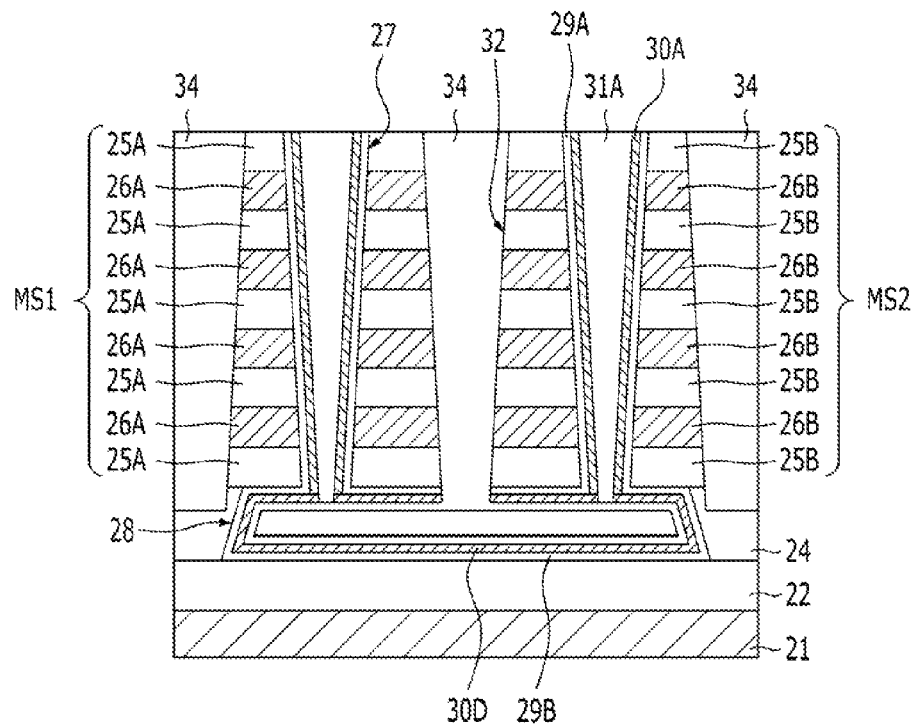
FIG. 2A is a cross-sectional view illustrating a three-dimensional non-volatile memory device in accordance with a first embodiment of the present invention.
Figure 2B:
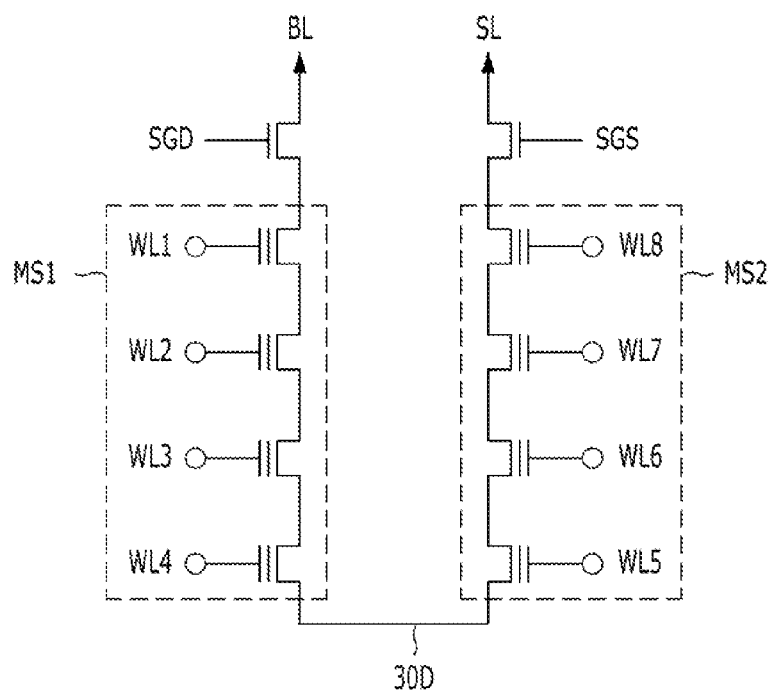
FIG. 2B is an equivalent circuit diagram of a non-volatile memory device in accordance with a first embodiment of the present invention.

FIG. 2A is a cross-sectional view illustrating a three-dimensional non-volatile memory device in accordance with a first embodiment of the present invention, and FIG. 2B is an equivalent circuit diagram of the non-volatile memory device in accordance with the first embodiment of the present invention.

Referring to FIGS. 2A and 2B, the non-volatile memory device in accordance with the first embodiment of the present invention includes first and second strings MS1 and MS2, which have a plurality of memory cells serially coupled to one another, respectively. The first string MS1 is coupled to the second string MS2 through a doped pipe channel 30D.

A pair of cell channels 30A are formed to extend in the vertical direction with respect to a substrate 21. The doped pipe channel 30D is formed to couple the lower ends of the pair of cell channels 30A to each other. The doped pipe channel 30D is buried in a first insulation layer 22 and a second insulation layer 24.

The first insulation layer 22 and the second insulation layer 24 according to an example include an oxide layer. A pipe channel hole 28 is formed in the second insulation layer 24. The pipe channel hole 28 has openings which are short in the row direction and long in the column direction as shown for the cell channel openings which are vertically long. The pipe channel hole 28 may be formed at a predetermined interval in the row direction and in the column direction. That is, the pipe channel hole 28 is formed in a matrix on a plane including the row direction and the column direction. The doped pipe channel 30D fills the pipe channel hole 28.

The first string MS1 includes third insulation layers 25A and control gate electrodes 26A, which are alternately stacked, and the second string MS2 includes third insulation layers 25B and control gate electrodes 26B, which are alternately stacked. The third insulation layers 25A and 25B and the control gate electrodes 26A and 26B are repeatedly formed in a line shape in such a manner so that they extend in the row direction and have a predetermined interval the column direction. The predetermined interval is provided by a slit 32. The third insulation layers 25A and 25B and the control gate electrodes 26A and 26B are formed in a stair shape at both ends of the non-volatile memory device in the row direction. The third insulation layers 25A and 25B include a silicon oxide layer. The control gate electrodes 26A and 26B according to an example are formed of P$^+$ polysilicon.

A pair of cell channel holes 27 are formed by tunneling through the third insulation layers 25A and 25B and the control gate electrodes 26A and 26B. The cell channel holes 27 are formed to be aligned in the vicinity of both ends of the pipe channel hole 28 in the column direction of the pipe channel hole 28.

The pair of cell channels 30A fill the cell channel holes 27, respectively. The cell channels 30A have a columnar shape that is hollow therein. The doped pipe channel 30D couples the lower ends of the pair of cell channels 30A to each other. The cell channels 30A and the doped pipe channel 30D form a substantially U-shaped structure. The cell channels 30A and the doped pipe channel 30D are formed of the same material. The cell channels 30A and the doped pipe channel 30D according to an example include a polysilicon layer, The cell channels 30A are undoped and the doped pipe channel 30D is doped. That is, the cell channels 30A and the doped pipe channel 30D are formed using the polysilicon layer, where the cell channels 30A are not doped with an impurity and the doped pipe channel 30D are doped with an impurity. The impurity doped in the doped pipe channel 30D includes an N type impurity such as phosphorus (P). The doped pipe channel 30D is hollow therein and fill the pipe channel hole 28. The impurity doped in the doped pipe channel 30D may have a concentration of at least $10^{19}$ atoms/cm$^3$ or more (approximately $10^{19}$ atoms/cm$^3$ to $10^{22}$ atoms/cm$^3$).

The non-volatile memory device includes a memory layer 29A which surrounds the cell channels 30A. The memory layer 29A is formed to surround the side surface of the cell channels 30A. Furthermore, a memory layer 29B is formed to cover the wall of the pipe channel hole 28. The memory layers 29A and 29B according to an example include a blocking layer, a charge trap layer and a tunnel insulation layer. The memory layers 29A and 29B are also called a memory gate insulation layer.

The control gate electrodes 26A and 26B between the cell channels 30A are separated from each other by the slit 32. The slit 32 may have a depth extending through the upper end of the doped pipe channel 30D. A fifth insulation layer 34 fills the slit 32. Furthermore, the fifth insulation layer 34 covers the surface of the doped pipe channel 30D in the pipe channel hole 28. The pipe channel hole 28 with the fifth insulation layer 34 is hollow, The slit 32 may extend through the upper end of the doped pipe channel 30D such that the hollow is opened.

As described above, the cell channels 30A, the memory layer 29A, and the control gate electrodes 26A and 26B form a memory cell, resulting in the formation of a structure in which a plurality of memory cells are serially coupled to one another. One memory string (for example, U-shaped memory string) includes a first string MS1 and a second string MS2. The first string MS1 is coupled to the second string MS2 through the doped pipe channel 30D, resulting in the formation of a substantially U-shaped memory string structure. One U-shaped memory string includes eight memory cells, where the first string MS1 and the second string MS2 include four memory cells, respectively. In another embodiment, the number of the memory cells may be increased to 16, 32, etc. Each of the control gate electrodes 26A and 26B is coupled to a respective one of word lines WL1 to WL8. The cross-sectional structures of drain selection transistor SGD, a source selection transistor SGS, a bit line BL, and a source line SL are apparent to a person of ordinary skill in the art.

Figure 3A:
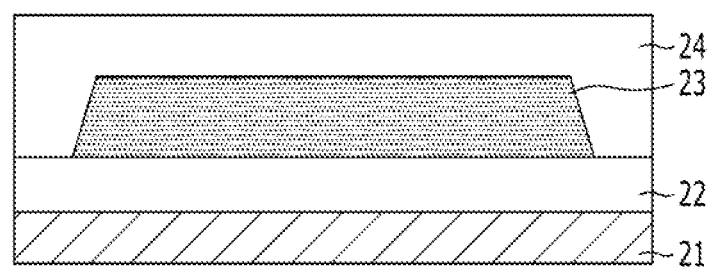
FIGS. 3A to 3J are cross-sectional views illustrating a method for fabricating a three-dimensional non-volatile memory device in accordance with a first embodiment of the present invention.

FIGS. 3A to 3J are cross-sectional views illustrating a method for fabricating the three-dimensional non-volatile memory device in accordance with the first embodiment of the present invention, Referring to FIG. 3A, the substrate 21 is prepared. The substrate 21 includes a semiconductor substrate. As one example, the substrate 21 includes a silicon substrate.

The first insulation layer 22 is formed on the substrate 21. The first insulation layer 22 includes an oxide layer. The first insulation layer 22 may include a silicon oxide layer.

A sacrificial pattern 23 is formed on the first insulation layer 22. The sacrificial pattern 23 may be formed by patterning an insulation layer. The sacrificial pattern 23 is a material which is removed n a subsequent process to provide a pipe channel hole. The sacrificial pattern 23 includes a nitride layer, and particularly, includes a silicon nitride layer. The sacrificial pattern 23 may be formed using a photolithography and etching method.

A second insulation layer 24 is formed on the first insulation layer 22 including the sacrificial pattern 23. The second insulation layer 24 includes a silicon oxide layer.

Figure 3B:
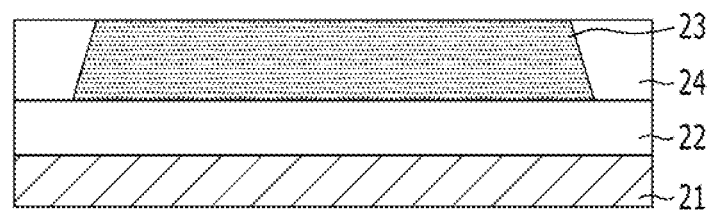

Referring to FIG. 3B, the second insulation layer 24 is subject to a planarization process. The planarization process includes a chemical mechanical polishing (CMP) process, and is performed by using the sacrificial pattern 23 as a stop layer. Since the sacrificial pattern 23 is a nitride layer and the second insulation layer 24 is an oxide layer, the second insulation layer 24 may be planarized such that the planarization process is stopped at the sacrificial pattern 23. Since the sacrificial pattern 23 is formed using the nitride layer and the second insulation layer 24 formed using the oxide layer is planarized, the CMP process may be easily controlled.

The second insulation layer 24 is planarized using the CMP process as described above, so that an insulation layer including the first insulation layer 22 and the second insulation layer 24 is formed on the substrate 21. The sacrificial pattern 23 fills the insulation layer.

Figure 3C:
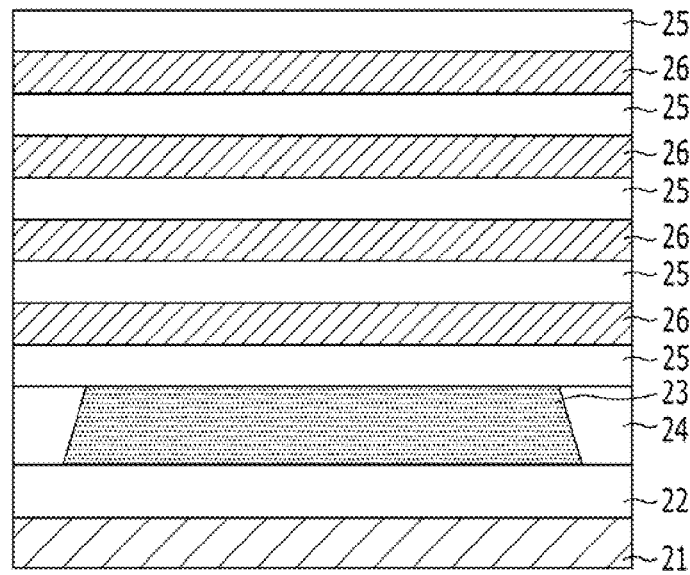

Referring to FIG. 3C, a third insulation layer 25 and a first conductive layer 26 are alternately stacked multiple times on the planarized second insulation layer 24 and the sacrificial pattern 21 The third insulation layer 25 serves as an isolation layer for isolating a plurality of control gate electrodes stacked in the vertical direction on one another. The third insulation layer 25 includes an oxide layer, and particularly, includes a silicon oxide layer. The first conductive to layer 26 serves as the control gate electrode of the memory cell and includes heavily doped $P^+$ polysilicon. The third insulation layer 25 and the first conductive layer 26 are repeatedly formed according to the number of memory cells to be stacked. In accordance with the first embodiment of the present invention, for the purpose of illustration, an example in which four memory cells are stacked are described.

A multilayer obtained by alternately stacking the third insulation layer 25 and the first conductive layer 26 multiple times will be referred as "a memory cell stack", and will also be referred as "an oxide polysilicon stack (OP stack)" because the third insulation layer 25 is an oxide layer and the first conductive layer 26 is a polysilicon layer.

Figure 3D:
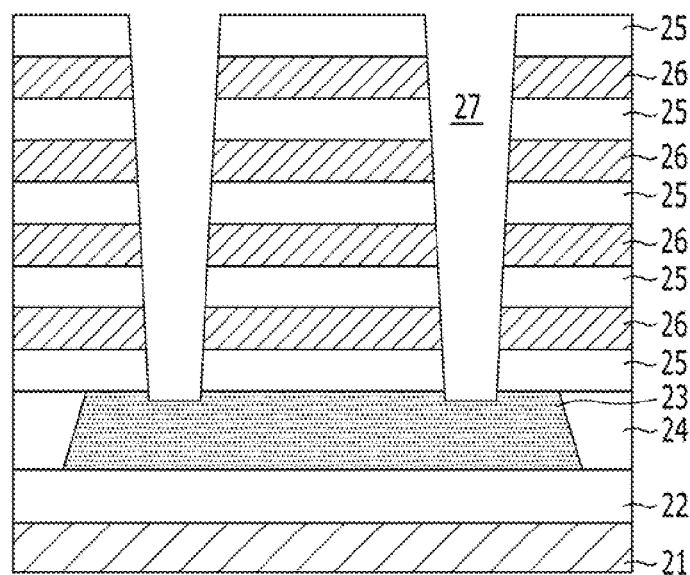

Referring to FIG. 3D, the multilayer of the third insulation layer 25 and the first conductive layer 26 is etched to form the plural cell channel holes 27 through which the surface of the sacrificial pattern 23 is exposed. The channel hole 27 is a space in which the channels of the memory cells are to be formed, and has a columnar shape, The channel holes 27 are formed as a pair in one U-shaped memory string.

Figure 3E:
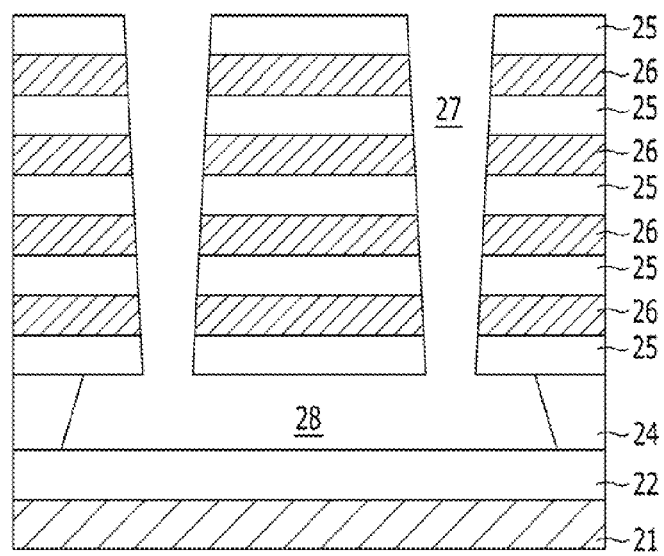

Referring to FIG. 3E, the sacrificial pattern 23 located below the channel holes 27 and exposed through the channel holes 27 is removed, so that the pipe channel hole 28 is formed. Since the sacrificial pattern 23 includes a nitride layer, a wet etching process using $H_3PO_4$ is performed. The pipe channel hole 28 is formed in a stacked layer of the first insulation layer 22 and the second insulation layer 24, and is a space in which the pipe channel is to be formed. As the pair of channel holes 27 are coupled to each other through the pipe channel hole 28, the channel holes 27 and the pipe channel hole 28 form a U shape.

Figure 3F:
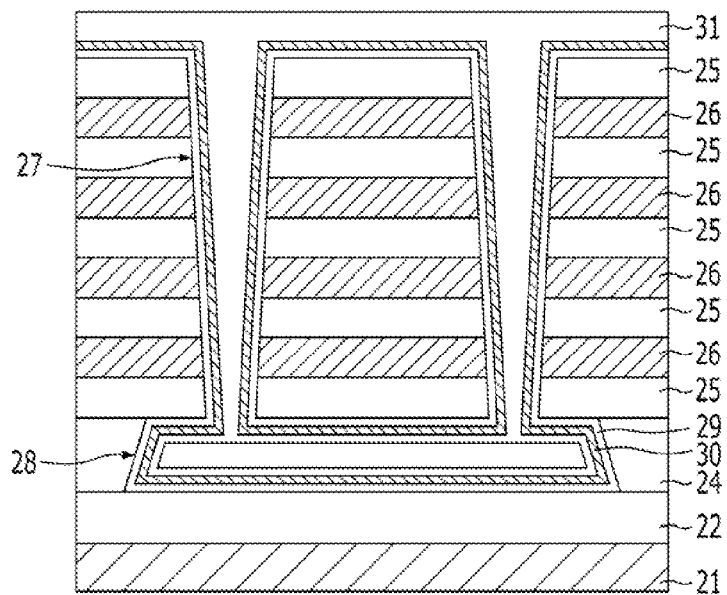

Referring to FIG. 3F, the memory layer 29 is formed on the resultant structure including the channel holes 27 and the pipe channel hole 28. The memory layer 29 is formed on the wall of the channel holes 27 and the pipe channel hole 28. The memory layer 29 includes a blocking layer, a charge trap layer and a tunnel insulation layer. Since, according to an example, the blocking layer and the tunnel insulation layer include an oxide layer, and the charge trap layer includes a nitride layer, the memory layer 29 has an oxide-nitride-oxide (ONO) layer. The memory layer 29 according to an example is formed by sequentially stacking the blocking layer, the charge trap layer and the tunnel insulation layer.

A second conductive layer 30 is formed on the memory layer 29. The second conductive layer 30 according to an example includes a silicon layer. Particularly, the second conductive layer 30 may include a polysilicon layer, and may include an undoped polysilicon layer doped with no impurity. The second conductive layer 30 is formed in the channel holes 27 and the pipe channel hole 28, and includes a hole therein.

A fourth insulation layer 31 is formed in order to fill the hole of the second conductive layer 30. The fourth insulation layer 31 has a thickness to the extent that the bottom of the channel holes 27 is, for example, completely filled. As described above, the fourth insulation layer 31 is formed such that the bottom of the channel holes 27 is filled, so that the pipe channel hole 28 is hollow therein.

Figure 3G:
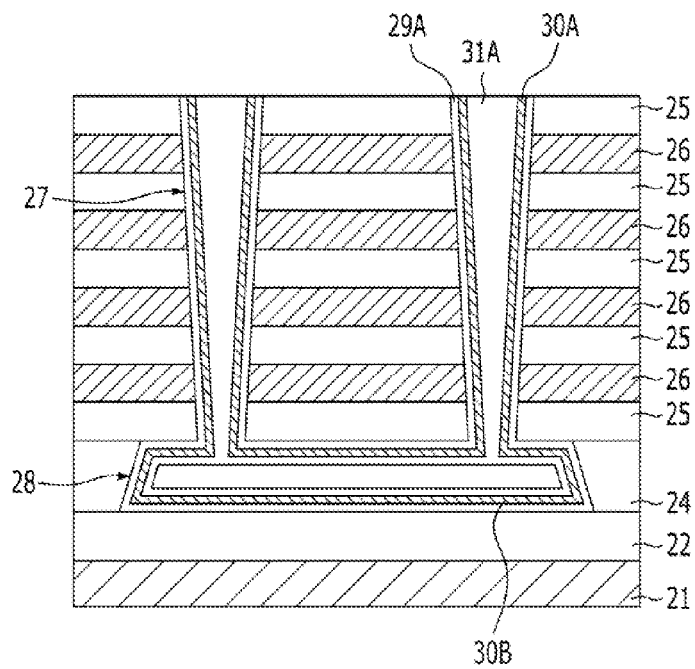

Referring to FIG. 3G, the fourth insulation layer 31 is planarized using a CMP process until the surface of the uppermost third insulation layer 25 is exposed. During the CMP process, the second conductive layer 30 and the memory layer 29 are also simultaneously planarized. Through the above planarization process, a memory layer 29A, second conductive layers 30A and 30B, and a fourth insulation layer 31A remain only in the channel holes 27 and the pipe channel hole 28. Hereinafter, the second conductive layer 30 remaining in the channel holes 27 of the second conductive layers 30A and 30B will be referred to as "a cell channel 30A", and the second conductive layer 30 remaining in the pipe channel hole 28 will be referred to as "a pipe channel 30B".

Figure 3H:
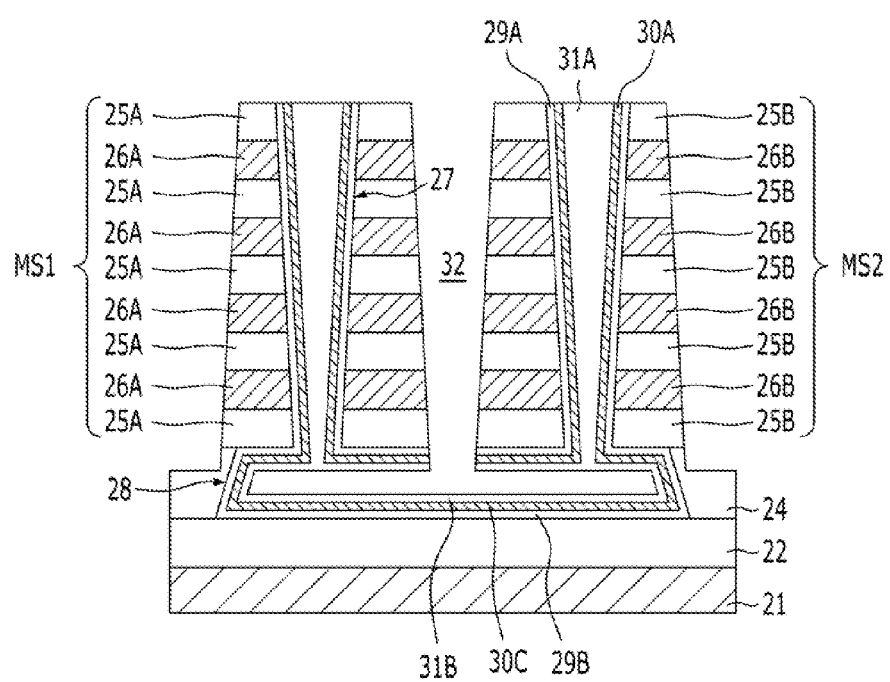

Referring to FIG. 3H, the slit 32 is formed. The slit 32 is formed by tunneling through the multilayer of the third insulation layer 25 and the first conductive layer 26. The slit 32 extends in one direction. At the time of a patterning process for forming the slit 32, the multilayer of the third insulation layer 25 and the first conductive layer 26 is etched up to a depth by which the pipe channel 30B, the memory layer 29A, and the fourth insulation layer 31A formed on the upper end of the pipe channel hole 28 are etched. Thus, a pipe channel, a memory layer, and a fourth insulation layer remain in the pipe channel hole 28 as indicated by reference numerals "30C", "29B" and "31B".

One, for example, U-shaped memory string is formed by the above-described slit 32. One pipe channel 30C corresponds to each memory string by the slit 32, One U-shaped memory string is divided into the first string MS1 and the second string MS2. The first string MS1 includes the control gate electrodes 26A, the cell channel 30A and the memory layer 29A, and the second string MS2 includes the control gate electrodes 26B, the cell channel 30A and the memory layer 29A. The first string MS1 is coupled to the second string MS2 through the pipe channel 30C.

The cell channels 30A are formed as a pair and the lower ends of the cell channels 30A are coupled to each other through the pipe channel 30C. The cell channels 30A and the pipe channel 30C form the substantially U-shaped structure. Particularly, the cell channels 30A have a structure with a pair of pillar types. Since the fourth insulation layer 31A fills the cell channels 30A and the memory layer 29A surrounds the side surface of the cell channels 30A, a macaroni structure is formed. The cell channel 30A serves as the channel of each memory cell.

The first conductive layer 26 serves as the control gate electrodes 26A and 26B. The control gate electrodes 26A and 26B surround the side surface of the cell channels 30A. The third insulation layers 25A serve as an isolation layer for isolating the control gate electrodes 26A stacked in the vertical direction from each other, and the third insulation layers 25B serve as an isolation layer for isolating the control gate electrodes 26B stacked in the vertical direction from each other. Since, according to an example, the memory layer 29A includes a charge trap layer, and the control gate electrodes 26A and 26B and the cell channel 30A includes a polysilicon layer, the memory cell with a silicon oxide nitride silicon (SONOS) structure is formed. The first string MS1 and the second string MS2 have a structure in which the memory cells are stacked in the vertical direction. Although not shown in FIG. 3H, both ends of each of the control gate electrodes 26A and 26B in any one direction have a stair structure for plugs and metal interconnections, respectively.

Figure 3I:
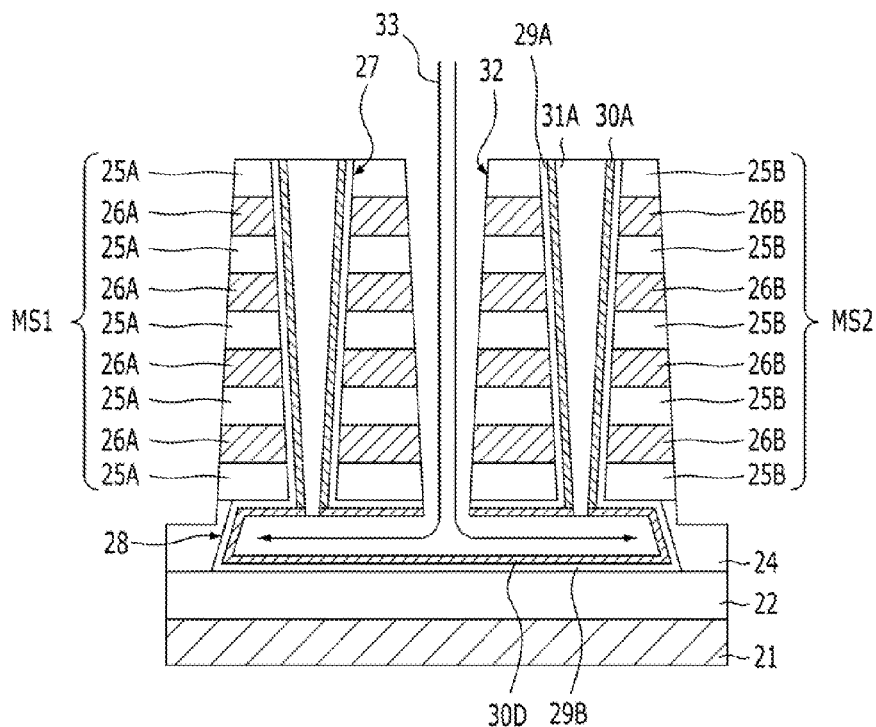

Referring to FIG. 3I, the fourth insulation layer 31B formed on the inner wall of the pipe channel hole 28 is removed. The fourth insulation layer 31B is removed using a wet etching process so that the surface of the pipe channel 30C is exposed in the pipe channel hole 28. The fourth insulation layer 31A remains only in the cell channel holes 27.

Plasma doping 33 is performed. Since the plasma doping 33 is performed in the pipe channel hole 28 exposed through the slit 32, the pipe channel 30C formed in the pipe channel hole 28 is doped with to an impurity. The impurity doped in the pipe channel 30C includes an N type impurity. As one example, since the plasma doping 33 is performed using gas such as $PH_3$, the pipe channel 30C is doped with phosphorous (P).

After the plasma doping 33 is performed, the pipe channel 30C becomes a doped pipe channel 30D doped with the impurity. The doped pipe channel 30D serves as a polysilicon layer doped with the N type impurity. The pair of cell channels 30A are coupled to each other through the doped pipe channel 30D. Thus, the doped pipe channel 30D couples the lower ends of the pair of cell channels 30A to each other, so that a pipe connection is made. The doped pipe channel 30D is buried in the insulation layer including the first insulation layer 22 and the second insulation layer 24. The doped pipe channel 30D may be hollow therein.

As described above, in the first embodiment, the doped pipe channel 30D coupling the lower ends of the pair of cell channels 30A to each other is formed using the plasma doping 33. That is, the doped pipe channel 30D may be formed using the polysilicon layer doped with the N type impurity, for example, without using a pipe gate.

Consequently, the fabricating process is simplified because it is not necessary to form the pipe gate. Furthermore, since the pipe gate is not formed, speed reduction due to the high resistance of the pipe gate does not occur.

As a result, in the first embodiment, the pair of adjacent cell channels 30A are electrically coupled to each other by using the doped pipe channel 30D without a pipe channel transistor.

Figure 3J:
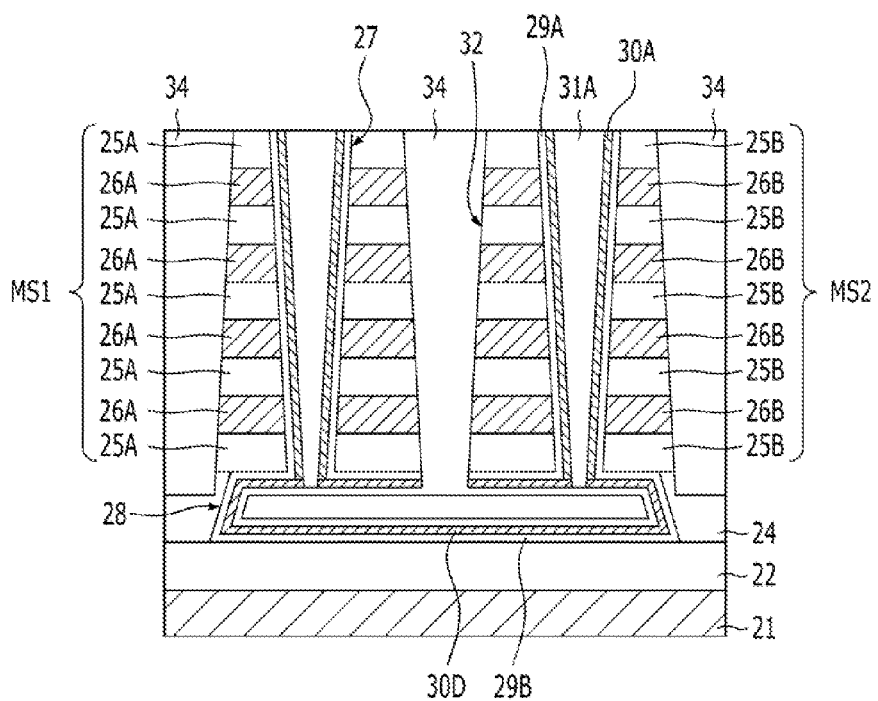

Referring to FIG. 3J, the fifth insulation layer 34 which gap-fills the slit 32 is formed and is subject to a planarization process by using a CMP process and the like. The fifth insulation layer 34 may have a thickness to the extent that the lower end of the slit 32 is filled. The fifth insulation layer 34 includes an oxide layer such as a silicon oxide layer.

Although not shown in FIG. 3J, a process for forming a select transistor may be performed. The select transistor may be formed before the slit 32 is formed.

The sidewalls of the control gate electrodes 26A and 26B may be silicified as follows.

Before the fifth insulation layer 34 is formed, when a metal layer is deposited in the state in which the upper end of the pipe channel hole 28 is opened by the slit 32, metal silicide is also formed in the pipe channel hole 28. Accordingly, a silicon nitride layer (or a silicon oxide layer) is deposited to completely fill the pipe channel hole 28, a silicide process is performed, and the silicon nitride layer is stripped. In this way, at the time of the silicide process, the doped pipe channel 30D may be substantially prevented from being silicified.

Figure 4:
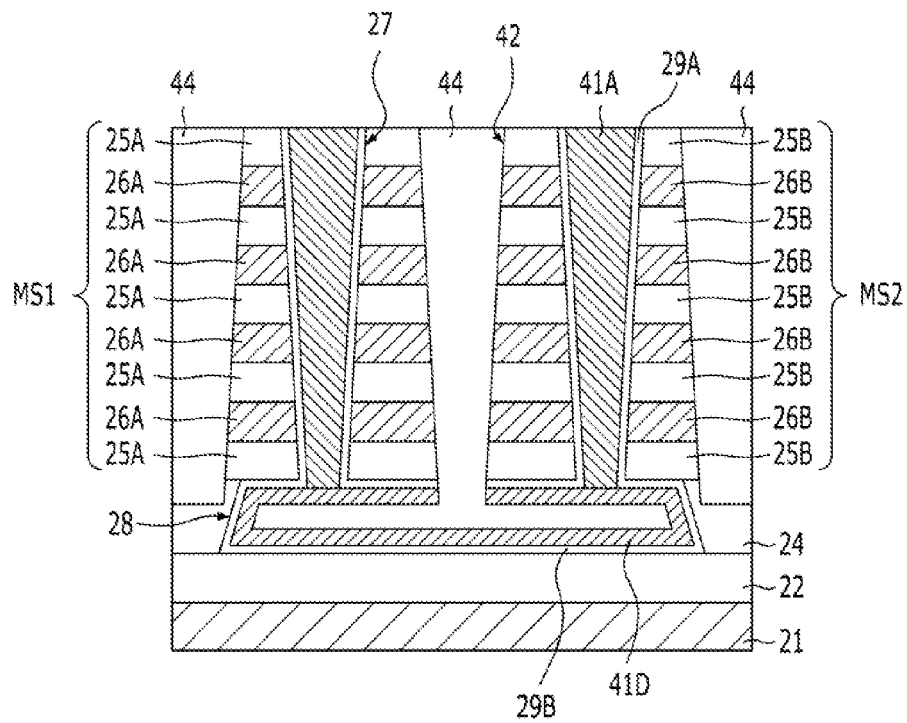
FIG. 4 is a cross-sectional view illustrating a three-dimensional non-volatile memory device in accordance with a second embodiment of the present invention.

FIG. 4 is a cross-sectional view illustrating a three-dimensional non-volatile memory device in accordance with a second embodiment of the present invention.

Referring to FIG. 4, the non-volatile memory device in accordance with the second embodiment of the present invention includes first and second strings MS1 and MS2, which have a plurality of memory cells serially coupled to one another, respectively, The first string MS1 is coupled to the second string MS2 through a doped pipe channel 41D.

A pair of cell channels 41A are formed to extend in the vertical direction with respect to a substrate 21. The doped pipe channel 41D is formed to couple the lower ends of the pair of cell channels 41A to each other. The doped pipe channel 41D is buried in a first insulation layer 22 and a second insulation layer 24.

The first insulation layer 22 and the second insulation layer 24 according to an example include an oxide layer. A pipe channel hole 28 is formed in the second insulation layer 24. The pipe channel hole 28 has openings which are short in the row direction and long in the column direction. The pipe channel hole 28 is formed at a predetermined interval in the row direction and in the column direction. That is, the pipe channel hole 28 is formed in a matrix on a plane including the row direction and the column direction. The doped pipe channel 41D fills the pipe channel hole 28.

The first string MS1 includes third insulation layers 25A and control gate electrodes 26A, which are alternately stacked, and the second string MS2 includes third insulation layers 25B and control gate electrodes 26B, which are alternately stacked. The third insulation layers 25A and 25B and the control gate electrodes 26A and 26B are repeatedly formed in a line shape in such a manner so that they extend in the row direction and have a predetermined interval in the column direction. The predetermined interval is provided by a slit 42. The third insulation layers 25A and 25B and the control gate electrodes 26A and 26B are formed in a stair shape at both ends of the non-volatile memory device in the row direction. The third insulation layers 25A and 25B include a silicon oxide layer. The control gate electrodes 26A and 26B according to an example are formed of P$^+$ polysilicon.

A pair of cell channel holes 27 are formed by tunneling through the third insulation layers 25A and 25B and the control gate electrodes 26A and 26B. The cell channel holes 27 are formed to be aligned in the vicinity of both ends of the pipe channel hole 28 in the column direction of the pipe channel hole 28.

The pair of cell channels 41A fill the cell channel holes 27, respectively. The cell channels 41A have a columnar shape with no hollow therein to completely fill the cell channel holes 27. The doped pipe channel 41D couples the lower ends of the pair of cell channels 41A to each other. The cell channels 41A and the doped pipe channel 41D form a substantially U-shaped structure. The cell channels 41A and the doped pipe channel 41D according to an example are formed of the same material. The cell channels 41A and the doped pipe channel 41D include a polysilicon layer. The cell channels 41A are undoped and the doped pipe channel 41D is doped. That is, the cell channels 41A and the doped pipe channel 41D are formed using the polysilicon layer, where the cell channels 41A are not doped with an impurity and the doped pipe channel 41D are doped with an impurity. The impurity doped in the doped pipe channel 41D includes an N type impurity such as phosphorus (P). The doped pipe channel 41D is hollow therein and fills the pipe channel hole 28. The impurity doped in the doped pipe channel 41D may have a concentration of at least $10^{19}$ atoms/cm$^3$ or more (approximately $10^{19}$ atoms/cm$^3$ to $10^{22}$ atoms/cm$^3$).

The non-volatile memory device includes a memory layer 29A which surround the cell channels 41A. The memory layer 29A is formed to surround the side surface of the cell channels 41A. Furthermore, a memory layer 29B is formed to cover the wall of the pipe channel hole 28. The memory layers 29A and 29B according to an example include a blocking layer, a charge trap layer and a tunnel insulation layer. The memory layers 29A and 29B are also called a memory gate insulation layer.

The control gate electrodes 26A and 26B between the cell channels 41A are separated from each other by the slit 42. The slit 42 may have a depth extending through the upper end of the doped pipe channel 41D. A fourth insulation layer 44 fills the slit 42. Furthermore, the fourth insulation layer 44 covers the surface of the doped pipe channel 41D in the pipe channel hole 28. The pipe channel hole 28 with the fourth insulation layer 44 is hollow. The slit 42 may extend through the upper end of the doped pipe channel 41D such that the hollow is opened.

As described above, the cell channels 41A, the memory layer 29A, and the control gate electrodes 26A and 26B form a memory cell, resulting in the formation of a structure in which a plurality of memory cells are serially coupled to one another. One, for example, U-Shaped memory string includes a first string MS1 and a second string MS2. The first string MS1 is coupled to the second string MS2 through the doped pipe channel 41D, resulting in the formation of a substantially U-shaped memory string structure. One U-shaped memory string includes eight memory cells, where the first string MS1 and the second string MS2 include four memory cells, respectively. In another embodiment, the number of the memory cells may be increased to 16, 32, etc. Each of the control gate electrodes 26A and 26B is coupled to a respective one of word lines WL1 to WL8. The cross-sectional structures of drain selection transistor SGD, a source selection transistor SGS, a bit line BL, and a source line SL are apparent to a person of ordinary skill in the art.

FIGS. 5A to 5E are cross-sectional views illustrating a method for fabricating the three-dimensional non-volatile memory device in accordance with the second embodiment of the present invention. A method for fabricating the cell channel hole and the pipe channel hole is the same as the method in accordance with the first embodiment.

Figure 5A:
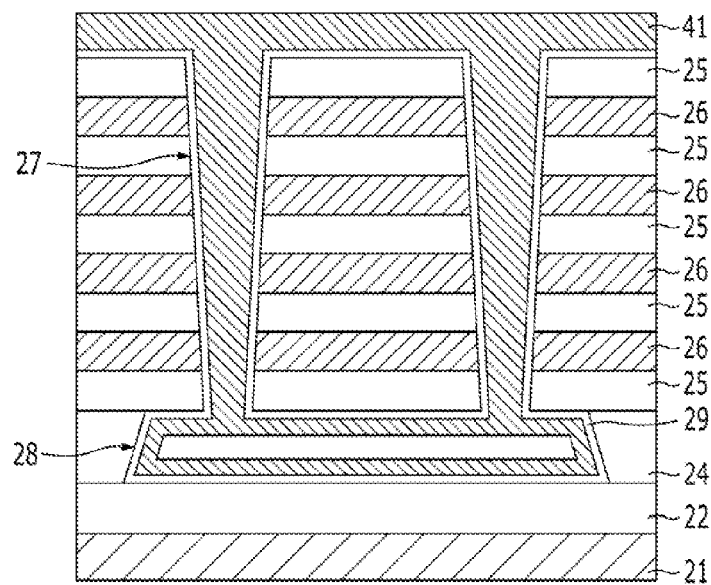
FIGS. 5A to 5E are cross-sectional views illustrating a method for fabricating a three-dimensional non-volatile memory device in accordance with a second embodiment of the present invention.

Referring to FIG. 5A, the memory layer 29 is formed on a resultant structure including the channel holes 27 and the pipe channel hole 28. The memory layer 29 is formed on the wall of the channel holes 27 and the pipe channel hole 28. The memory layer 29 according to an example includes a blocking layer, a charge trap layer and a tunnel insulation layer. Since the blocking layer and the tunnel insulation layer include an oxide layer, and the charge trap layer includes a nitride layer, the memory layer 29 has an oxide-nitride-oxide (ONO) layer. The memory layer 29 according to an example is formed by sequentially stacking the blocking layer, the charge trap layer and the tunnel insulation layer.

A second conductive layer 41 is formed on the memory layer 29. The second conductive layer 41 includes a silicon layer. Particularly, the second conductive layer 41 includes a polysilicon layer, and may include an undoped polysilicon layer doped with no impurity. The second conductive layer 41 is formed in the channel holes 27 and the pipe channel hole 28 to fill the channel holes 27. Accordingly, the second conductive layer is not formed in the pipe channel hole 28 from the time point at which the bottom of the channel holes 27 are filled, and the second conductive layer 41 fills the channel holes 27. The second conductive layer is hollow in the pipe channel hole 28 and the second conductive layer 41 fills the channel holes 27.

Figure 5B:
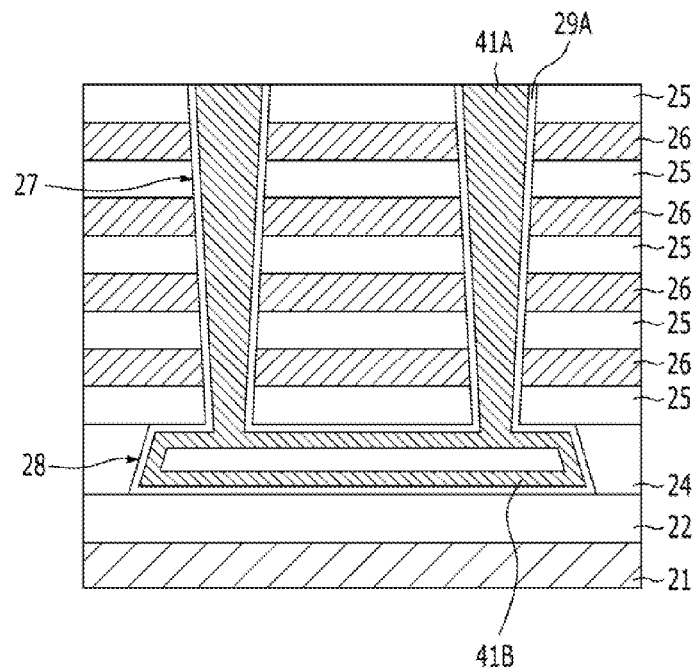

Referring to FIG. 5B, the second conductive layer 41 planarized using a CMP process until the surface of the uppermost third insulation layer 25 is exposed. During the CMP process, the memory layer 29 is also simultaneously planarized. Through the above planarization process, a memory layer 29A and second conductive layers 41A and 41B remain, for example, in the channel holes 27 and the pipe channel hole 28 only. Hereinafter, the second conductive layer 41 remaining in the channel holes 27 of the second conductive layers 41A and 418 will be referred to as "a cell channel 41A", and the second conductive layer 41 remaining in the pipe channel hole 28 will be referred to as "a pipe channel 41B". The cell channels 41A and the pipe channel 41B form a substantially U-shaped structure. Particularly, the cell channels 41A have a pillar type. The memory layer 29A surrounds the side surface of the cell channels 41A having the pillar type. Also, the cell channel 41A fills a hole the channel holes 27, a filled structure is formed. The filled structure is different from the macaroni structure shown in FIG. 2A.

The cell channel 41A serves as the channel of each memory cell. The pipe channel 41B couples the lower ends of the cell channels 41A having the pillar type to each other. Accordingly, the lower ends of the pair of cell channels 41A are coupled to each other through the pipe channel 41B, so that the substantially U-shaped structure is formed.

Figure 5C:
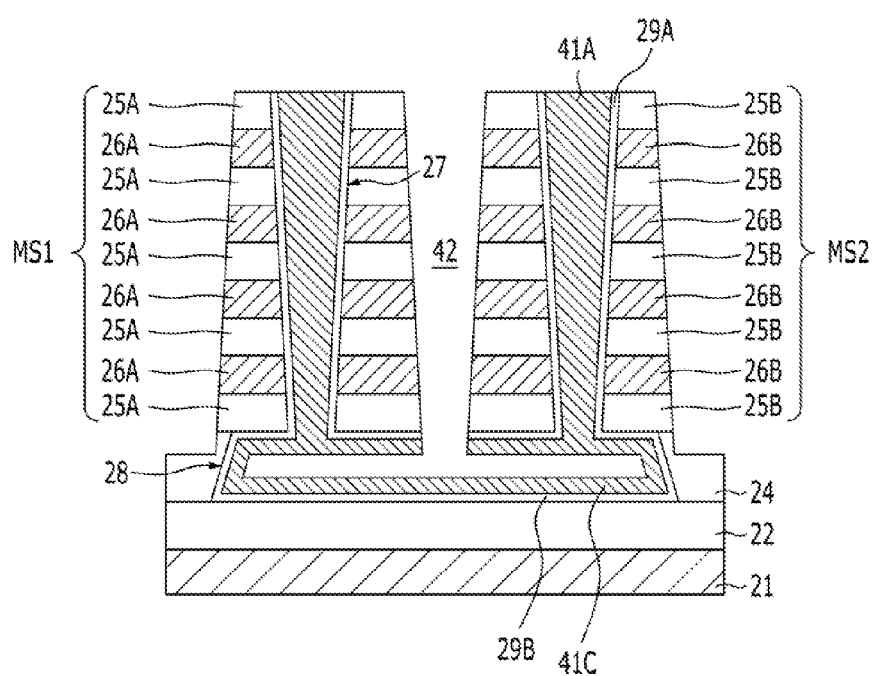

Referring to FIG. 5C, the slit 42 is formed. The slit 42 is formed by tunneling through the multilayer of the third insulation layer 25 and the first conductive layer 26. The slit 42 extends in one direction. At the time of a patterning process for forming the slit 42, the multilayer of the third insulation layer 25 and the first conductive layer 26 is etched up to a depth by which the pipe channel 41B and the memory layer 29A formed on the upper end of the pipe channel hole 28 are etched. Thus a pipe channel and a memory layer remain in the pipe channel hole 28 as indicated by reference numerals "41C" and "29B".

One U-shaped memory string is formed by the above-described slit 42. One U-shaped memory string is divided into the first string MS1 and the second string MS2. The first string MS1 includes the control gate electrodes 26A and the cell channel 41A, and the second string MS2 includes the control gate electrodes 26B and the cell channel 41A. The first string MS1 is coupled to the second string MS2 through the pipe channel 41C.

The cell channels 41A are formed as a pair and the lower ends of the cell channels 41A are coupled to each other through the pipe channel 41C. The cell channels 41A and the pipe channel 41C form the substantially U-shaped structure. Particularly, the cell channels 41A have a structure with a pair of pillar types. The memory layer 29A surrounds the side surface of the cell channels 41A. The cell channel 41A serves as the channel of each memory cell.

The first conductive layer 26 serves as the control gate electrodes 26A and 26B. The control gate electrodes 26A and 26B surround the side surface of the cell channels 41A. The third insulation layers 25A serve as an isolation layer for isolating the control gate electrodes 26A stacked in the vertical direction from each other, and the third insulation layers 25B serve as an isolation layer for isolating the control gate electrodes 26B stacked in the vertical direction from each other. Since, according to an example, the memory layer 29A includes a charge trap layer, and the control gate electrodes 26A and 26B and the cell channel 41A include a polysilicon layer, the memory cell with a silicon oxide nitride silicon (SONOS) structure is formed. The first string MS1 and the second string MS2 have a structure in which the memory cells are stacked in the vertical direction. Although not shown in FIG. 5C, both ends of each of the control gate electrodes 26A and 26B in any one direction have a stair structure for plugs and metal interconnections.

Figure 5D:
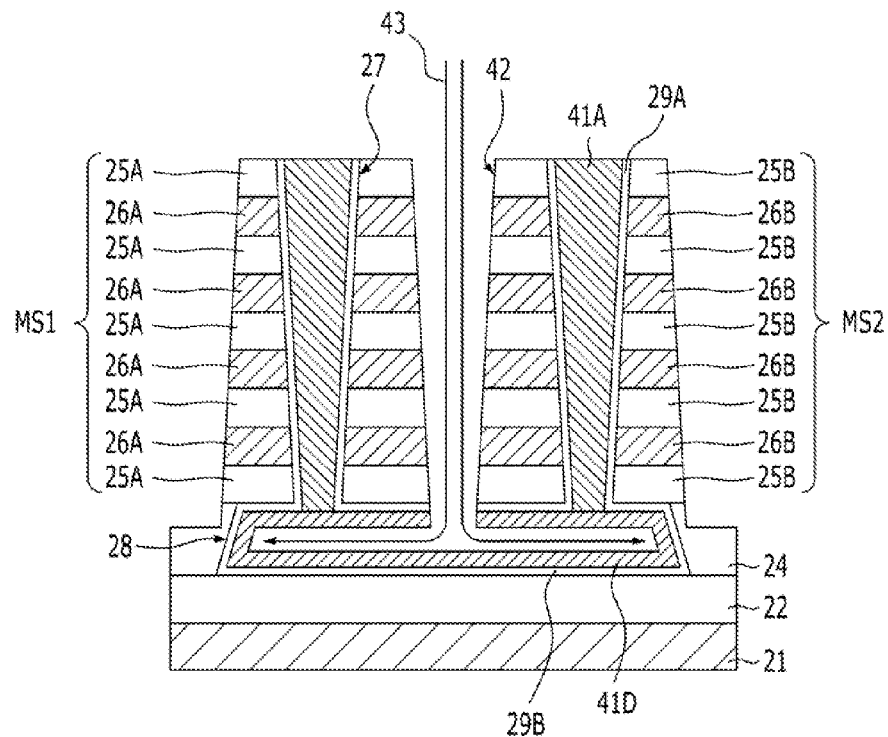

Referring to FIG. 5D, plasma doping 43 is performed, Since the plasma doping 43 is performed in the pipe channel hole 28 exposed through the slit 42, the pipe channel 41C formed in the pipe channel hole 28 is doped with an impurity, The impurity doped in the pipe channel 41C according to an example includes an N type impurity. As one example, since the plasma doping 43 is performed using gas such as $PH_3$, the pipe channel 41C is doped with phosphorous (P).

After the plasma doping 43 is performed, the pipe channel 41C becomes a doped pipe channel 41D. The doped pipe channel 41D serves as a polysilicon layer doped with the N type impurity. The pair of cell channels 41A are coupled to each other through the doped pipe channel 41D. Thus, the doped pipe channel 41D couples the lower ends of the pair of cell channels 41A to each other, so that a pipe connection is made. The doped pipe channel 41D is buried in the insulation layer including the first insulation layer 22 and the second insulation layer 24. The doped pipe channel 41D may have a hollow therein.

As described above, in the second embodiment, the doped pipe channel 41D coupling the lower ends of the pair of cell channels 41A to each other is formed using the plasma doping 43. That is, the doped pipe channel 41D may be formed using the polysilicon layer doped with the N type impurity, for example, without using a pipe gate.

Consequently, the fabricating process is simplified because it is not necessary to form the pipe gate. Furthermore, since the pipe gate is not formed, speed reduction due to the high resistance of the pipe gate does not occur.

As a result, in the second embodiment, the pair of adjacent cell channels 41A are electrically coupled to each other by using the doped pipe channel 41D without a pipe channel transistor.

Figure 5E:
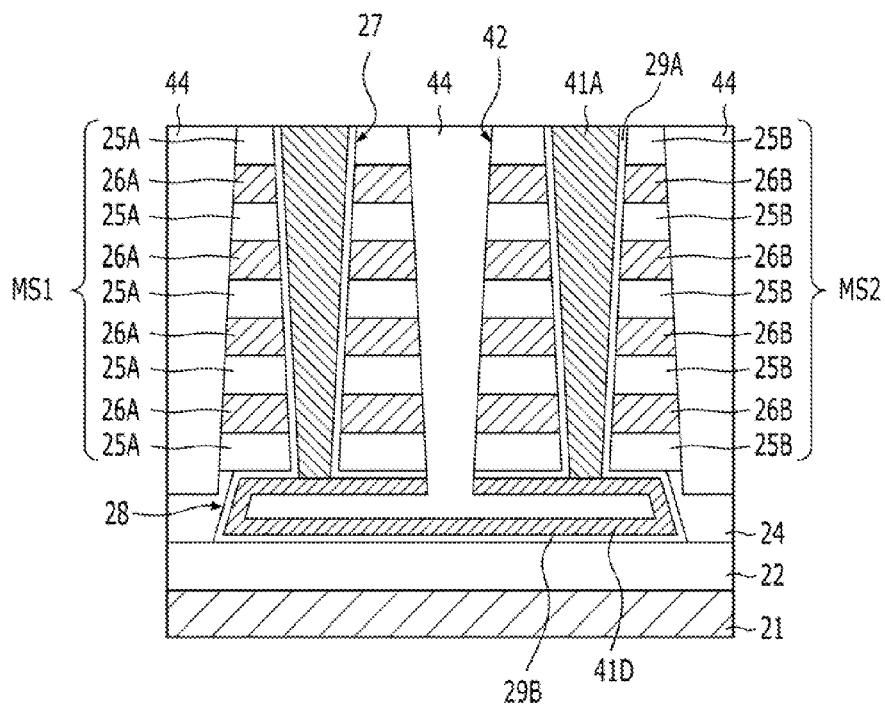

Referring to FIG. 5E, the fourth insulation layer 44 which gap-fills the slit 42 is formed and is subject to a planarization process by using a CMP process and the like.

Although not shown in FIG. 5E, a process for forming a select transistor may be performed. The select transistor may be formed before the slit is formed.

Figure 6:
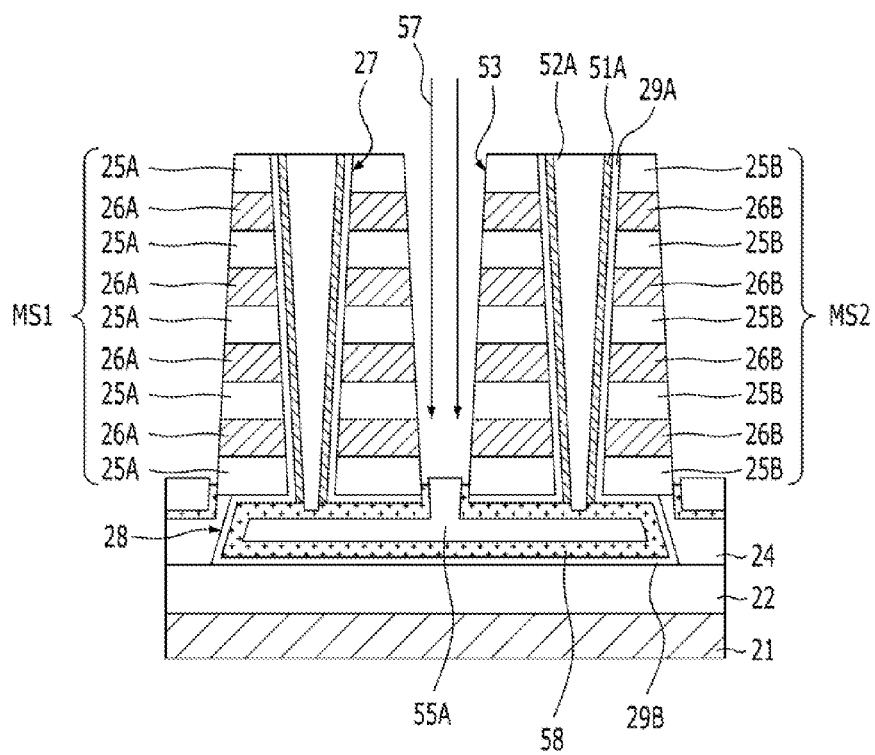
FIG. 6 is a cross-sectional view illustrating a three-dimensional non-volatile memory device in accordance with a third embodiment of the present invention.

FIG. 6 is a cross-sectional view illustrating a three-dimensional non-volatile memory device in accordance with a third embodiment of the present invention, Referring to FIG. 6, the non-volatile memory device in accordance with the third embodiment of the present invention includes first and second strings MS1 and MS2, which have a plurality of memory cells serially coupled to one another, respectively. The first string MS1 is coupled to the second string MS2 through a doped pipe channel 58.

A pair of cell channels 51A are formed to extend in the vertical direction with respect to a substrate 21. The doped pipe channel 58 is formed to couple the lower ends of the pair of cell channels 51A to each other. The doped pipe channel 58 is buried in a first insulation layer 22 and a second insulation layer 24.

The first insulation layer 22 and the second insulation layer 24 according to an example include an oxide layer. A pipe channel hole 28 is formed in the second insulation layer 24. The pipe channel hole 28 has openings which are short in the row direction and long in the column direction as shown for the cell channel openings which are vertically long. The pipe channel hole 28 may be formed at a predetermined interval in the row direction and in the column direction. That is, the pipe channel hole 28 is formed in a matrix on a plane including the row direction and the column direction. The doped pipe channel 58 fills the pipe channel hole 28.

The first string MS1 includes third insulation layers 25A and control gate electrodes 26A, which are alternately stacked, and the second string MS2 includes third insulation layers 25B and control gate electrodes 26B, which are alternately stacked. The third insulation layers 25A and 25B and the control, gate electrodes 26A and 26B are repeatedly formed in a line shape in such a manner so that they extend in the row direction and have a predetermined interval in the column direction. The predetermined interval is provided by a slit 53. The third insulation layers 25A and 25B and the control gate electrodes 26A and 26B are formed in a stair shape at both ends of the non-volatile memory device in the row direction. The third insulation layers 25A and 25B include a silicon oxide layer. The control gate electrodes 26A and 26B according to an example are formed of $P^+$ polysilicon.

A pair of cell channel holes 27 are formed by tunneling through the third insulation layers 25A and 25B and the control gate electrodes 26A and 26B. The cell channel holes 27 are formed to be aligned in the vicinity of both ends of the pipe channel hole 28 in the column direction of the pipe channel hole 28.

The pair of cell channels 51A fill the cell channel holes 27, respectively. The cell channels 51A have a columnar shape that is hollow therein. The doped pipe channel 58 couples the lower ends of the pair of cell channels 51A to each other. The cell channels 51A and the doped pipe channel 58 form a substantially U-shaped structure. The cell channels 51A and the doped pipe channel 58 according to an example are formed of the same material. The cell channels 51A and the doped pipe channel 58 may include polysilicon layer. The cell channels 51A are undoped and the doped pipe channel 58 is doped. That is, the cell, channels 51A and the doped pipe channel 58 are formed using the polysilicon layer, where the cell channels 51A are not doped with an impurity and the doped pipe channel 58 are doped with an impurity. The impurity doped in the doped pipe channel 58 includes an N type impurity such as phosphorus (P). The doped pipe channel 58 is hollow therein and fills the pipe channel hole 28. A fifth insulation layer 55A fills the doped pipe channel 58. The doped pipe channel 58 and the fifth insulation layer 55A have a height extending to the lower end of the slit 53. The impurity doped in the doped pipe channel 58 may have a concentration of at least $10^{19}$ atoms/cm$^3$ or more (approximately $10^{19}$ atoms/cm$^3$ to $10^{22}$ atoms/cm$^3$).

The non-volatile memory device includes a memory layer 29A which surround the cell channels 51A. The memory layer 29A is formed to surround the side surface of the cell channels 51A. Furthermore, a memory layer 29B is formed to cover the wall of the pipe channel hole 28. The memory layers 29A and 29B according to an example include a blocking layer, a charge trap layer and a tunnel insulation layer. The memory layers 29A and 29B are also called a memory gate insulation layer.

The control gate electrodes 26A and 26B between the cell channels 51A are separated from each other by the slit 53. The slit 53 may have a depth extending through the upper end of the doped pipe channel 58.

As described above, the cell channels 51A, the memory layer 29A, and the control gate electrodes 26A and 26B form a memory cell, resulting in the formation of a structure in which a plurality of memory cells are serially coupled to one another. One U-shaped memory string includes a first string MS1 and a second string MS2. The first string MS1 is coupled to the second string MS2 through the doped pipe channel 58, resulting in the formation of a substantially U-shaped memory string structure. One U-shaped memory string includes eight memory cells, and the first string MS1 and the second string MS2 include four memory cells, respectively. In another embodiment, the number of the memory cells may be increased to 16, 32, etc. Each of the control gate electrodes 26A and 26B is coupled to word lines WL1 to WL8. The cross-sectional structures of drain selection transistor SGD, a source selection transistor SGS, a bit line BL, and a source line SL are apparent to a person of ordinary skill in the art.

FIGS. 7A to 7F are cross-sectional views illustrating a method for fabricating the three-dimensional non-volatile memory device in accordance with the third embodiment of the present invention. A method for fabricating the cell channel hole and the pipe channel hole is the same as the method in accordance with the first embodiment.

Figure 7A:
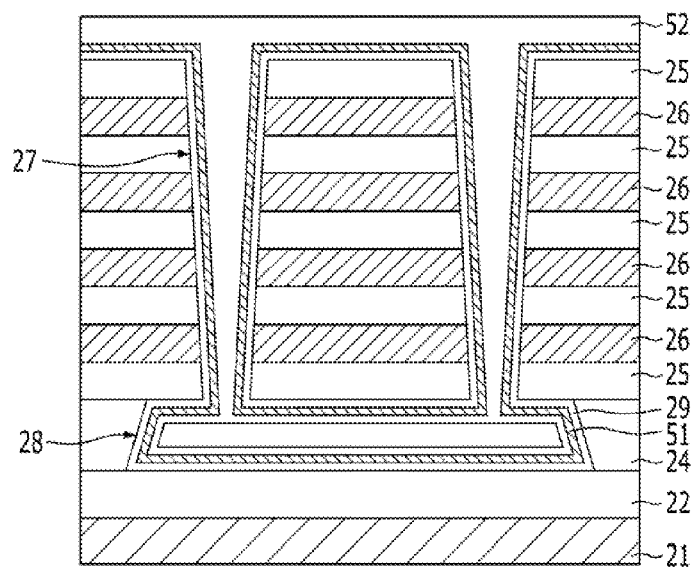
FIGS. 7A to 7F are cross-sectional views illustrating a method for fabricating a three-dimensional non-volatile memory device in accordance with a third embodiment of the present invention.

Referring to FIG. 7A, the memory layer 29 is formed on a resultant structure including the channel holes 27 and the pipe channel hole 28. The memory layer 29 is formed on the wall of the channel holes 27 and the pipe channel hole 28. The memory layer 29 according to an example includes a blocking layer, a charge trap layer and a tunnel insulation layer. Since the blocking layer and the tunnel insulation layer include an oxide layer, and the charge trap layer includes a nitride layer, the memory layer 29 has an oxide-nitride-oxide (ONO) layer. The memory layer 29 according to an example is formed by sequentially stacking the blocking layer, the charge trap layer and the tunnel insulation layer.

A second conductive layer 51 is formed on the memory layer 29. The second conductive layer 51 includes a silicon layer. Particularly, the second conductive layer 51 includes a polysilicon layer, and may include an undoped polysilicon layer doped with no impurity. The second conductive layer 51 is formed in the channel holes 27 and the pipe channel hole 28, and includes a hole therein.

A fourth insulation layer 52 is formed in order to fill the hole of the second conductive layer 51. The fourth insulation layer 52 has a thickness to the extent that the bottom of the channel holes 27 is filled. As described above, the fourth insulation layer 52 is formed such that the bottom of the channel holes 27 is filled, so that the pipe channel hole 28 is hollow therein.

Figure 7B:
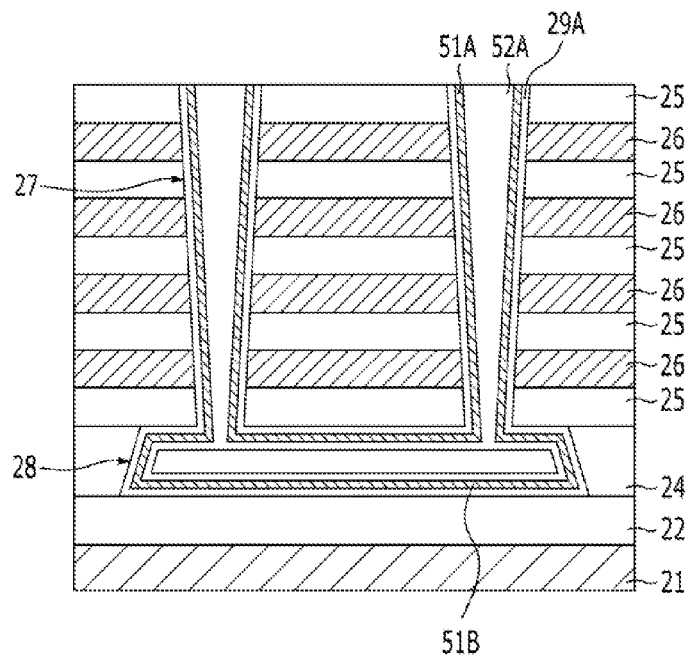

Referring to FIG. 7B, the fourth insulation layer 52 is planarized using a CMP process until the surface of the uppermost third insulation layer 25 is exposed. During the CMP process, the second conductive layer 51 and the memory layer 29 are also simultaneously planarized.

Through the above planarization process, a memory layer 29A, second conductive layers 51A and 51B, and a fourth insulation layer 52A remain for example, in the channel holes 27 and the pipe channel hole 28 only. Hereinafter, the second conductive layer 51 remaining in the channel holes 27 of the second conductive layers 51A and 51B will be referred to as "a cell channel 51A", and the second conductive layer 51 remaining in the pipe channel hole 28 be referred to as "a pipe channel 51B".

The memory layer 29, the cell channels 51A and the fourth insulation layer 52A form the substantially U-shaped structure, Particularly, the cell channels 51A have a pillar type structure, Since the fourth insulation layer 52A fills the cell channel 51A and the memory layer 29A surrounds the side surface of the cell channels 51A, a macaroni structure is formed. The cell channel 51A serves as the channel of each memory cell. The pipe channel 51B filled in the pipe channel hole 28 couples the lower ends of the pair of cell channels 51A to each other.

Figure 7C:
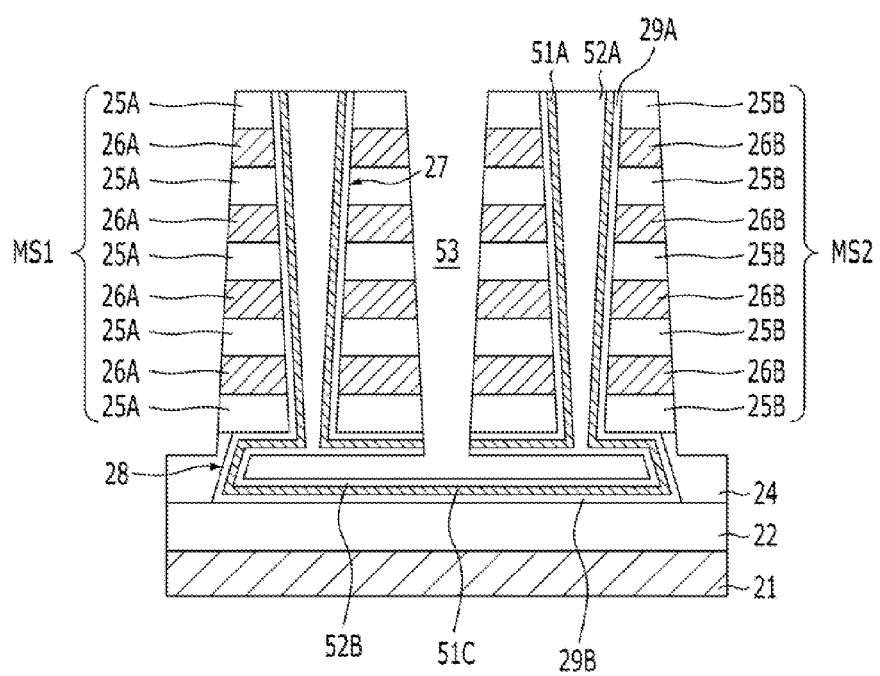

Referring to FIG. 7C, the slit 53 is formed. The slit 53 is formed by tunneling through the multilayer of the third insulation layer 25 and the first conductive layer 26. The slit 53 extends in one direction. At the time of a patterning process for forming the slit 32, the multilayer of the third insulation layer 25 and the first conductive layer 26 is etched up to a depth by which the pipe channel 51B, the memory layer 29A, and the fourth insulation layer 52A formed on the upper end of the pipe channel hole 28 are etched. Thus, a pipe channel, a memory layer, and a fourth insulation layer remain in the pipe channel hole 28 as indicated by reference numerals "51C" "29B" and "52B".

One U-shaped memory string including the first string MS1 and the second string MS2 is formed by the above-described slit 53. The first conductive layer 26 serves as the control gate electrodes 26A and 26B. The third insulation layers 25A serve as an isolation layer for isolating the control gate electrodes 26A stacked in the vertical direction from each other, and the third insulation layers 25B serve as an isolation layer for isolating the control gate electrodes 26B stacked in the vertical direction from each other. Since, according to an example, the memory layer 29A includes a charge trap layer, and the control gate electrodes 26A and 26B and the cell channel 51A include a polysilicon layer, the memory cell with a silicon oxide nitride silicon (SONOS) structure is formed. The first string MS1 and the second string MS2 have a structure in which the memory cells are stacked in the vertical direction. Although not shown in FIG. 7C, both ends of each of the control gate electrodes 26A and 26B in any one direction have a stair structure for plugs and metal interconnections.

Figure 7D:
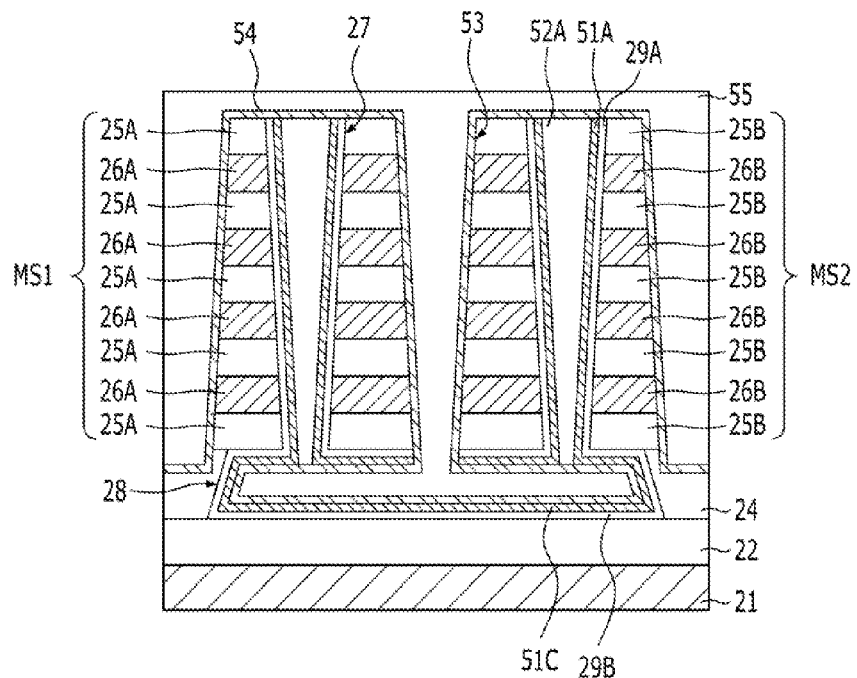

Referring to FIG. 7D, the fourth insulation layer 52B formed on the inner wall of the pipe channel hole 28 is removed. The fourth insulation layer 52B is removed using a wet etching process, so that the surface of the pipe channel 51C according to an example is exposed. The fourth insulation layer 52A remains only in the cell channel holes 27.

A third conductive layer 54 is formed on a resultant structure including the slit 53. The third conductive layer 54 according to an example includes a polysilicon layer, and particularly, includes a polysilicon layer doped with a high concentration impurity. The third conductive layer 54 is also formed on the surface of the pipe channel 51C in the pipe channel hole 28.

A fifth insulation layer 55 is formed on the third conductive layer 54 to fill the slit 53 and the pipe channel hole 28. The fifth insulation layer 55 includes a silicon oxide layer or a silicon nitride layer.

Figure 7E:
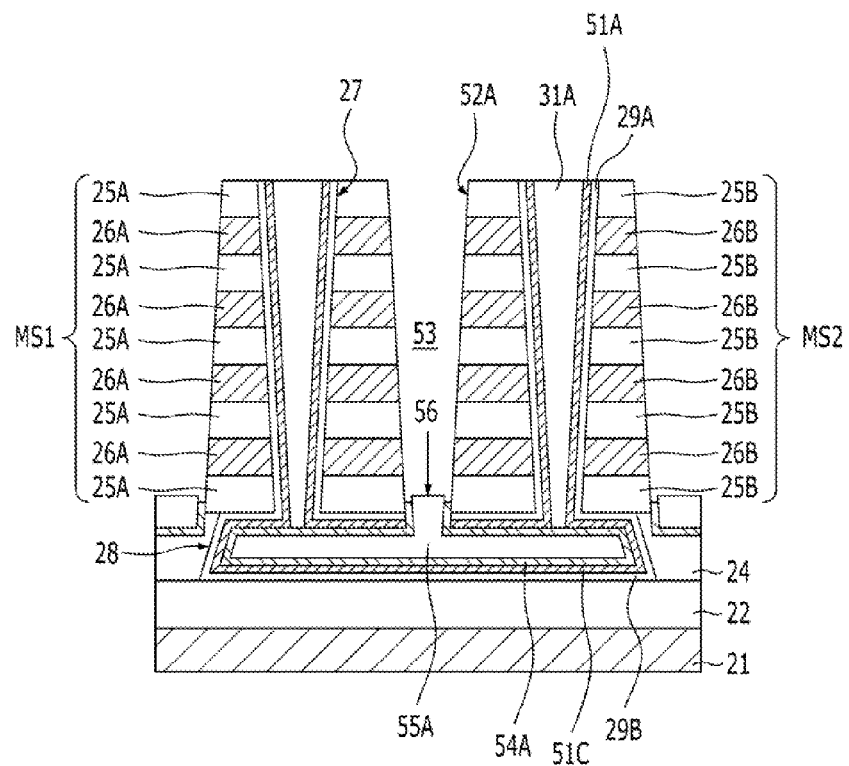

Referring to FIG. 7E, the fifth insulation layer 55 is recessed 56 through partial stripping. Accordingly, a fifth insulation layer 55A is high enough to fill the vicinity of sidewalls of the lowermost third insulation layers 25A and 25B. That is, the fifth insulation layer 55A is high enough to fill the lower end of the slit 53.

The third conductive layer 54 exposed in removing the fifth insulation layer 55A is selectively removed to be recessed. Accordingly, a third conductive layer 54A is high enough to fill the lower end of the slit 53, and may have a height which is level with or lower than the height of the fifth insulation layer 55A. The third conductive layer 54A may be high enough to be connected to the pipe channel 51C formed in the pipe channel hole 28. The recessed third conductive layer 54A may remain to couple the lower ends of the pair of adjacent cell channels 51A to the pipe channel 51C.

Figure 7F:
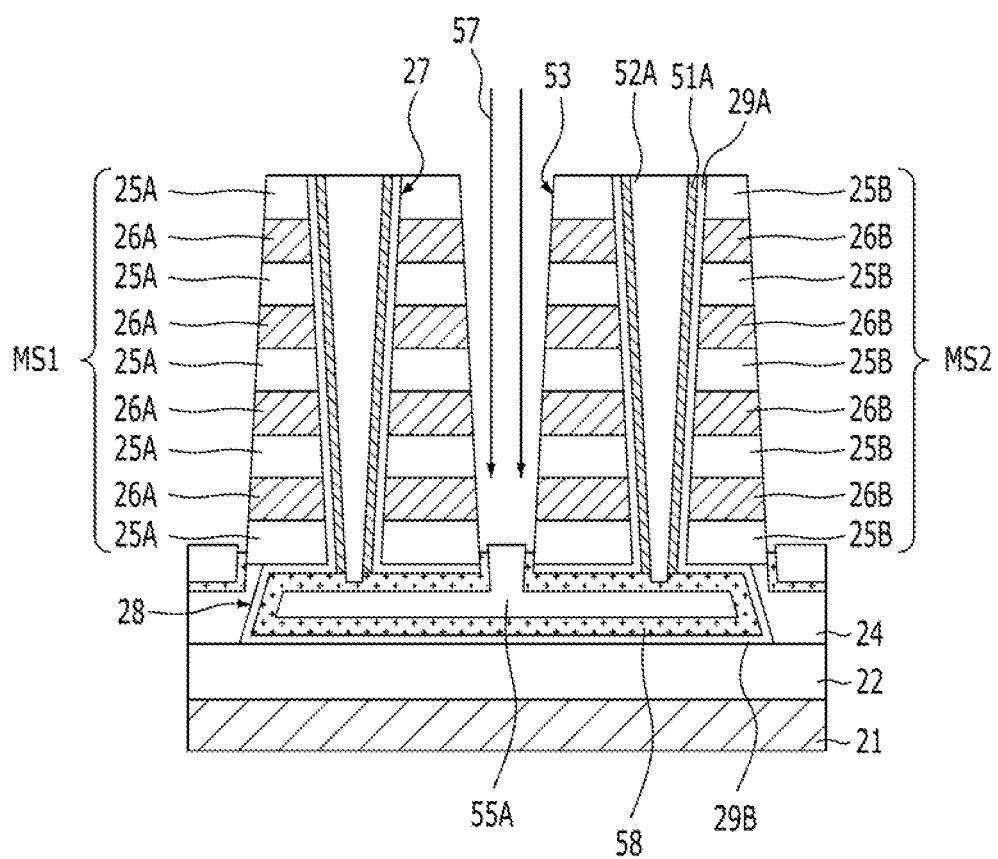

Referring to FIG. 7F, a heat treatment process 57 is performed, so that the impurity doped in the third conductive layer 54A is diffused up to the pipe channel 51C formed in the pipe channel hole 28. Thus, the third conductive layer 54A and the pipe channel 51C are doped with the same impurity. As a result the pipe channel having gone through the heat treatment process 57 couples the lower ends of the cell channels 51A to each other as indicated by reference numeral 58, and becomes the doped pipe channel 58 doped with the impurity.

Although not shown in FIG. 7F, a process for forming a select transistor may be performed. The select transistor may be formed before the slit is formed.

As described above, in the third embodiment, the doped pipe channel 58 coupling the lower ends of the pair of cell channels 51A to each other is formed using the third conductive layer 54A doped with the high concentration impurity and the heat treatment process 57. That is, the doped pipe channel 58 is formed using the polysilicon layer doped with the N type impurity and the heat treatment process, without, for example, using a pipe gate.

Consequently, the fabricating process is simplified because it is not necessary to form the pipe gate. Furthermore, since the pipe gate is not formed, speed reduction due to the high resistance of the pipe gate does not occur.

Figure 8:
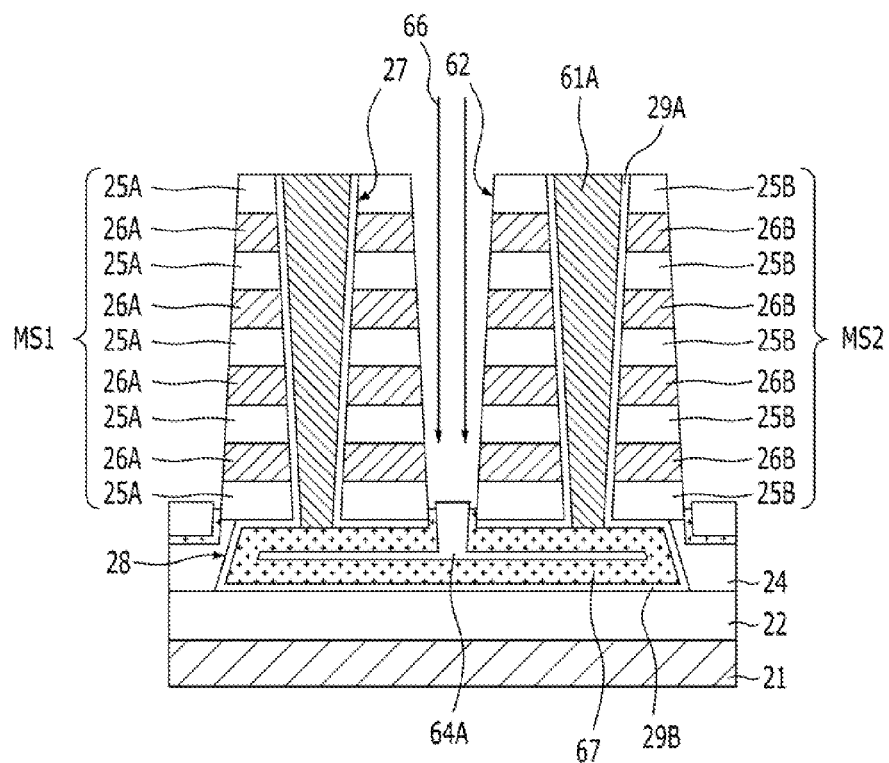
FIG. 8 is a cross-sectional view illustrating a three-dimensional non-volatile memory device in accordance with a fourth embodiment of the present invention.

FIG. 8 is a cross-sectional view illustrating a three-dimensional non-volatile memory device in accordance with a fourth embodiment of the present invention.

Referring to FIG. 8, the non-volatile memory device in accordance with the fourth embodiment of the present invention includes first and second strings MS1 and MS2, which have a plurality of memory cells serially coupled to one another, respectively. The first string MS1 is coupled to the second string MS2 through a doped pipe channel 67.

A pair of cell channels 61A are formed to extend in the vertical direction with respect to a substrate 21. The doped pipe channel 67 is formed to couple the lower ends of the pair of cell channels 61A to each other. The doped pipe channel 67 is buried in a first insulation layer 22 and a second insulation layer 24.

The first insulation layer 22 and the second insulation layer 24 according to an example include an oxide layer. A pipe channel hole 28 is formed in the second insulation layer 24. The pipe channel hole 28 has openings which are short in the row direction and long in the column direction as shown for the cell channel openings which are vertically long. The pipe channel hole 28 may be formed at a predetermined interval in the row direction and in the column direction. That is, the pipe channel hole 28 is formed in a matrix on a plane including the row direction and the column direction. The doped pipe channel 67 fills the pipe channel hole 28.

The first string MS1 includes third insulation layers 25A and control gate electrodes 26A, which are alternately stacked, and the second string MS2 includes third insulation layers 25B and control gate electrodes 26B, which are alternately stacked. The third insulation layers 25A and 25B and the control gate electrodes 26A and 26B are repeatedly formed in a line shape in such a manner so that they extend in the row direction and have a predetermined interval in the column direction. The predetermined interval is provided by a slit 62. The third insulation layers 25A and 25B and the control gate electrodes 26A and 26B are formed in a stair shape at both ends of the non-volatile memory device in the row direction. The third insulation layers 25A and 25B include a silicon oxide layer. The control gate electrodes 26A and 26B according to an example are formed of P$^+$ polysilicon.

A pair of cell channel holes 27 are formed by tunneling through the third insulation layers 25A and 25B and the control gate electrodes 26A and 26B. The cell channel holes 27 are formed to be aligned in the vicinity of both ends of the pipe channel hole 28 in the column direction of the pipe channel hole 28, The pair of cell channels 61A fill the cell channel holes 27, respectively. The cell channels 61A have a columnar shape that is not hollow therein to completely fill the cell channel holes 27. The doped pipe channel 67 couples the lower ends of the pair of cell channels 61A to each other. The cell channels 61A and the doped pipe channel 67 form a substantially U-shaped structure. The cell channels 61A and the doped pipe channel 67 are formed of the same material. The cell channels 61A and the doped pipe channel 67 include a polysilicon layer. The cell channels 61A are undoped and the doped pipe channel 67 is doped. That is, the cell channels 61A and the doped pipe channel 67 are formed using the polysilicon layer, where the cell channels 61A are not doped with an impurity and the doped pipe channel 67 are doped with an impurity. The impurity doped in the doped pipe channel 67 includes an N type impurity such as phosphorus (P). The doped pipe channel 67 is hollow therein and fills the pipe channel hole 28. A fourth insulation layer 64A fills the doped pipe channel 67. The doped pipe channel 67 and the fourth insulation layer 64A have a height extending to the lower end of the slit 62. The impurity doped in the doped pipe channel 67 may have a concentration of at least $10^{19}$ atoms/cm$^3$ or more (approximately $10^{19}$ atoms/cm$^3$ to $10^{22}$ atoms/cm$^3$).

The non-volatile memory device includes a memory layer 29A which surround the cell channels 61A. Furthermore, a memory layer 29B is formed to cover the wall of the pipe channel hole 28. The memory layers 29A and 29B according to an example include a blocking layer, a charge trap layer and a tunnel insulation layer. The memory layers 29A and 29B are also called a memory gate insulation layer.

The control gate electrodes 26A and 26B between the cell channels 61A are separated from each other by the slit 62. The slit 62 may have a depth extending through the upper end of the doped pipe channel 67.

As described above, the cell channels 61A, the memory layer 29A, and the control gate electrodes 26A and 26B form a memory cell, resulting in the formation of a structure in which a plurality of memory cells are serially coupled to one another. One U-shaped memory string includes a first string MS1 and a second string MS2. The first string MS1 is coupled to the second string MS2 through the doped pipe channel 67, resulting in the formation of a substantially U-shaped memory string structure. One, for example, U-shaped memory string includes eight memory cells, and the first string MS1 and the second string MS2 include four memory cells, to respectively. In another embodiment, the number of the memory cells may be increased to 16, 32, etc. Each of the control gate electrodes 26A and 26B is coupled to word lines. The cross-sectional structures of drain selection transistor SGD, a source selection transistor SGS, a bit line BL, and a source line SL are apparent to a person of ordinary skill in the art.

FIGS. 9A to 9F are cross-sectional views illustrating a method for fabricating the three-dimensional non-volatile memory device in accordance with the fourth embodiment of the present invention. A method for fabricating the cell channel hole and the pipe channel hole is the same as the method in accordance with the first embodiment.

Figure 9A:
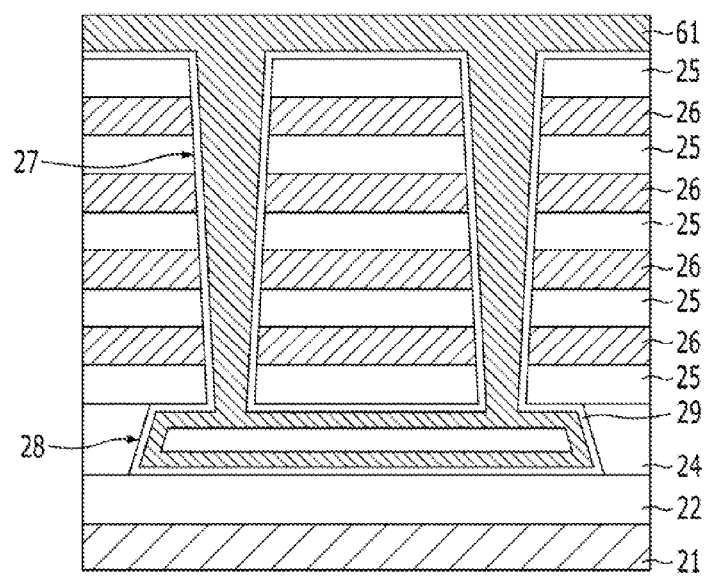
FIGS. 9A to 9F are cross-sectional views illustrating a method for fabricating a three-dimensional non-volatile memory device in accordance with a fourth embodiment of the present invention.

Referring to FIG. 9A, the memory layer 29 is formed on a resultant structure including the channel holes 27 and the pipe channel hole 28. The memory layer 29 is formed on the wall of the channel holes 27 and the pipe channel hole 28. The memory layer 29 according to an example includes a blocking layer, a charge trap layer and a tunnel insulation layer. Since the blocking layer and the tunnel insulation layer include an oxide layer, and the charge trap layer includes a nitride layer, the memory layer 29 has an oxide-nitride-oxide (ONO) layer. The memory layer 29 according to an example is formed by sequentially stacking the blocking layer, the charge trap layer and the tunnel insulation layer.

A second conductive layer 61 is formed on the memory layer 29. The second conductive layer 61 includes a silicon layer. Particularly, the second conductive layer 61 includes a polysilicon layer, and may include an undoped polysilicon layer doped with no impurity. The second conductive layer 61 is formed in the channel holes 27 and the pipe channel hole 28 to fill the channel holes 27. Accordingly, the second conductive layer is not formed in the pipe channel hole 28 from the time point at which the bottom of the channel holes 27 are filled, and the second conductive layer 61 fills the channel holes 27 only.

Figure 9B:
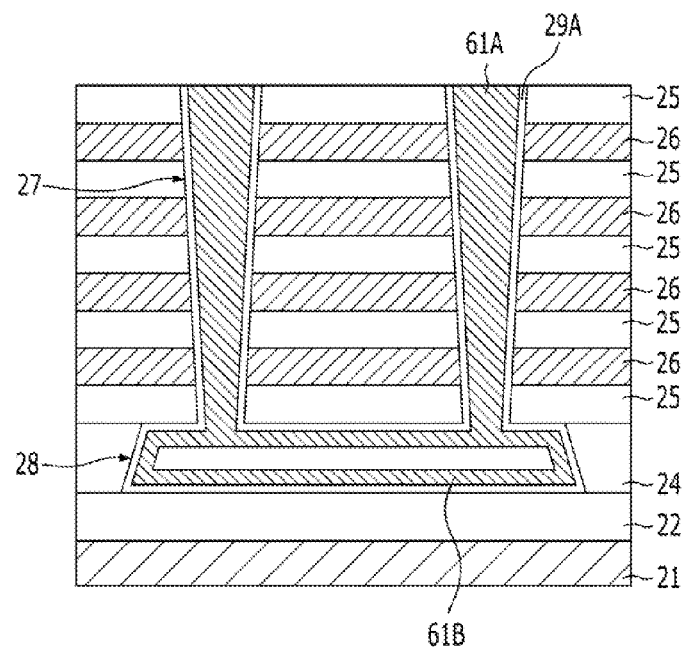

Referring to FIG. 9B, the second conductive layer 61 is planarized using a CMP process until the surface of the uppermost third insulation layer 25 is exposed. During the CMP process, the memory layer 29 is also simultaneously planarized. Through the above planarization process, a memory layer 29A, cell channels 61A, and a pipe channel 61B remain only in the channel holes 27 and the pipe channel hole 28. The cell channels 61A and the pipe channel 61B form the substantially U-shaped structure. Particularly, the cell channels 61A have a pillar type structure. The memory layer 29A surrounds the side surface of the cell channels 61A having the pillar type structure. The cell channel 61A serves as the channel of each memory cell.

Figure 9C:
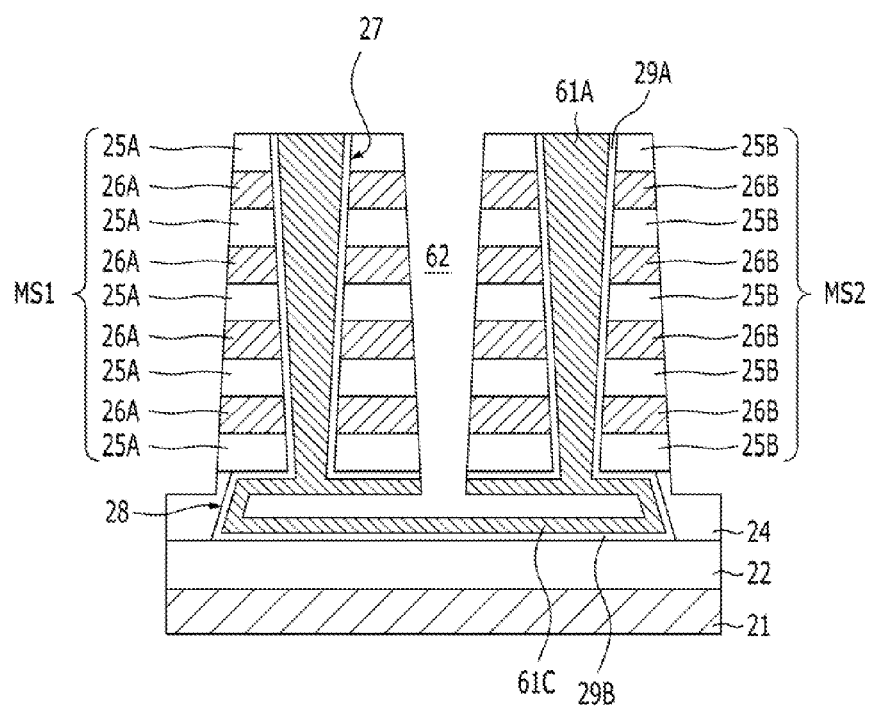

Referring to FIG. 9C, the slit 62 is formed. The slit 62 is formed by tunneling through the multilayer of the third insulation layer 25 and the first conductive layer 26. The slit 62 extends in one direction. At the time of a patterning process for forming the slit 62, the multilayer of the third insulation layer 25 and the first conductive layer 25 is etched up to a depth by which the pipe channel 61B and the memory layer 29A formed on the upper end of the pipe channel hole 28 are etched. Thus, a pipe channel and a memory layer remain in the pipe channel hole 28 as indicated by reference numerals "61C" and "29B".

One U-shaped memory string including the first string MS1 and the second string MS2 is formed by the above-described slit 62. The first conductive layer 26 serves as the control gate electrodes 26A and 26B. The third insulation layers 25A serve as an isolation layer for isolating the control gate electrodes 26A stacked in the vertical direction from each other, and the third insulation layers 25B serve as an isolation layer for isolating the control gate electrodes 26B stacked in the vertical direction from each other. Since, according to an example, the memory layer 29A includes a charge trap layer, and the control gate electrodes 26A and 26B and the cell channel 51A include a polysilicon layer, the memory cell with a silicon oxide nitride silicon (SONOS) structure is formed, The first string MS1 and the second string MS2 have a structure in which the memory cells are stacked in the vertical direction. Although not shown in FIG. 9C, both ends of each of the control gate electrodes 26A and 26B in any one direction have a stair structure for plugs and metal interconnections.

Figure 9D:
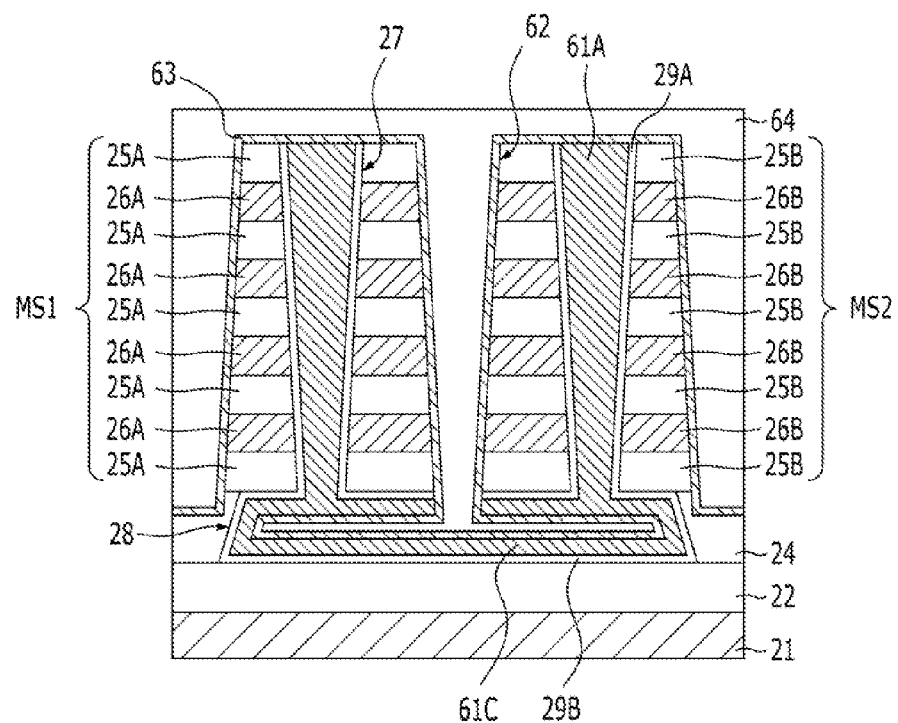

Referring to FIG. 9D, a third conductive layer 63 is formed on the resultant structure including the slit 62. The third conductive layer 63 includes a polysilicon layer, and particularly, includes a polysilicon layer doped with a high concentration impurity. The third conductive layer 63 is also formed in the pipe channel hole 28.

A fourth insulation layer 64 is formed on the third conductive layer 63 to fill the pipe channel hole 28. The fourth insulation layer 64 according to an example includes a silicon oxide layer or a silicon nitride layer.

Figure 9E:
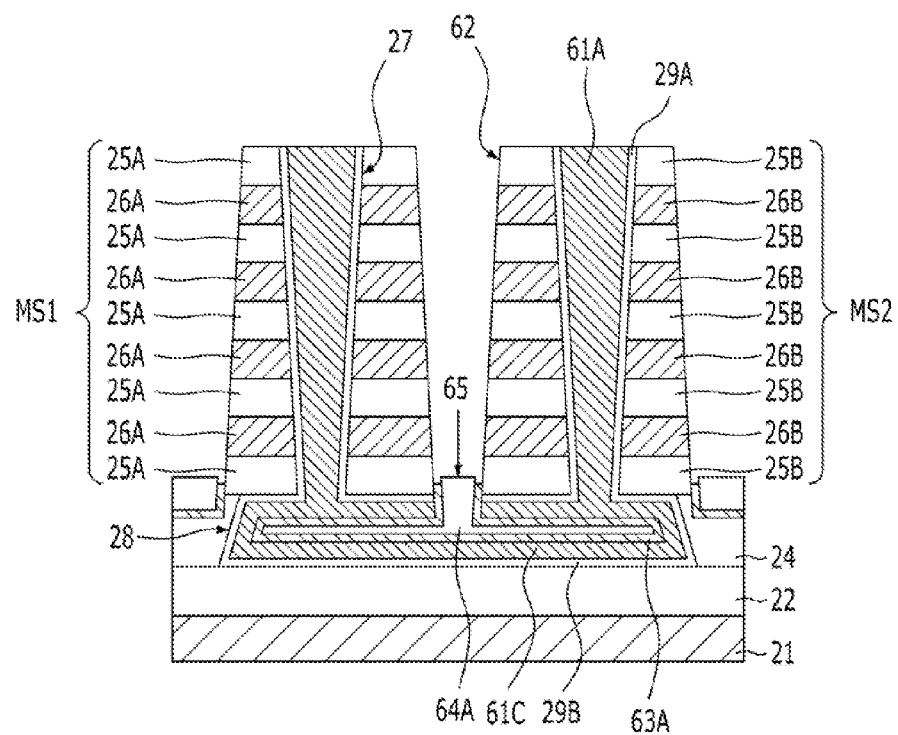

Referring to FIG. 9E, the fourth insulation layer 64 is recessed 65 through partial stripping. Accordingly, a fourth insulation layer 64A is high enough to fill the vicinity of sidewalls of the lowermost third insulation layer 25B. That is, the fourth insulation layer 64A is high enough to fill the lower end of the slit 62.

The third conductive layer 63 exposed in removing the fourth insulation layer 64A is selectively removed to be recessed. Accordingly, a third conductive layer 63A is high enough to fill the lower end of the slit 62, and may have a height which is level with or lower than the height of the fourth insulation layer 64A. The third conductive layer 63A may have a height enough to be connected to the pipe channel 61C formed in the pipe channel hole 28. The recessed third conductive layer 63A couples the pipe channel 61C.

Figure 9F:
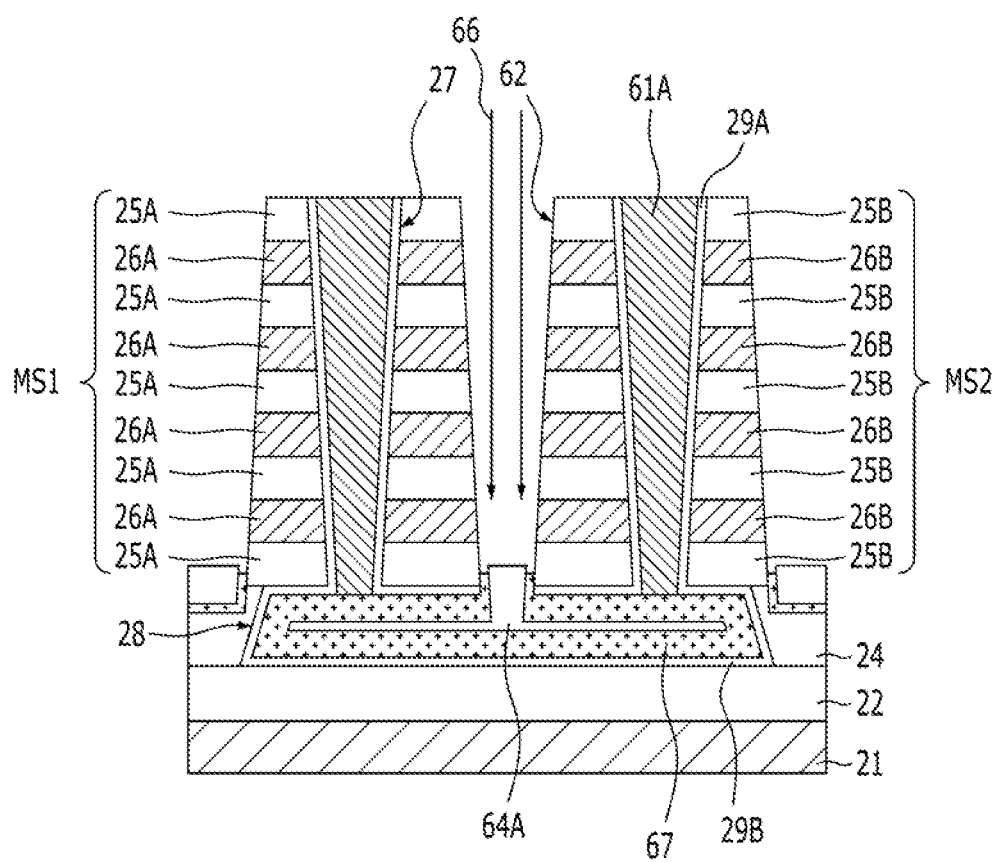

Referring to FIG. 9F, a heat treatment process 66 is performed, so that the impurity doped in the third conductive layer 64A is diffused up to the pipe channel 61C formed in the pipe channel hole 28. Thus, the pipe channel having gone through the heat treatment process 66 couples the lower ends of the cell channels 61A to each other as indicated by reference numeral 67, and becomes the doped pipe channel 67 doped with the impurity.

Although not shown in FIG. 9F, a process for forming a select transistor may be performed. The select transistor may be formed before the slit is formed.

As described above, in the fourth embodiment, the doped pipe channel 67 coupling the lower ends of the pair of cell channels 61A to each other is formed using the third conductive layer 63A doped with the high concentration impurity and the heat treatment process 66. That is, the doped pipe channel 67 is formed using the polysilicon layer doped with the N type impurity and the heat treatment process, without using a pipe gate.

Consequently, the fabricating process is simplified because it is not necessary to form the pipe gate. Furthermore, since the pipe gate is not formed, speed reduction due to the high resistance of the pipe gate does not occur.

In accordance with the previous embodiments of the present invention, a pair of adjacent cell channels are electrically coupled to each other by using a doped pipe channel without a pipe channel transistor.

In accordance with the present invention as described above, a doped pipe channel which couples the lower ends of a pair of columnar cell channels to each other is formed using plasma doping or a process for additively forming a doped polysilicon layer, so that the fabricating process is simplified because it is not necessary to form a pipe gate.

Furthermore, as a doped pipe channel doped with an impurity is used, a pipe gate is not needed to be used. Thus, since speed reduction due to the high resistance of the pipe gate does not occur, the operation speed of a non-volatile memory device may be improved.

While the present invention has been described with respect to the specific embodiments, it will be apparent to those skilled in the art which various changes and modifications may be made without departing from the spirit and scope of the invention as defined in the following claims.

What is claimed is:

1. A non-volatile memory device comprising:
a pair of columnar cell channels vertically extending from a substrate;
a doped pipe channel arranged to couple lower ends of the pair of columnar cell channels;
insulation layers over the substrate in which the doped pipe channel is buried;
memory layers arranged to surround side surfaces of the columnar cell channels;
control gate electrodes arranged to surround the side surfaces of the memory layers; and
a slit arranged to tunnel through an upper end of the doped pipe channel.

2. The non-volatile memory device of claim 1, wherein each of the columnar cell channels is undoped.

3. The non-volatile memory device of claim 1, wherein each of the columnar cell channels includes an undoped polysilicon layer and the doped pipe channel includes a doped polysilicon layer.

4. The non-volatile memory device of claim 1, wherein the slit is arranged to separate the control gate electrodes for controlling a first one of the columnar cell channels from the control gate electrodes for controlling the other one of the columnar cell channels.

5. The non-volatile memory device of claim 4, further comprising an insulation layer arranged to fill the slit.

6. The non-volatile memory device of claim 1, wherein the doped pipe channel includes a polysilicon layer doped with an N type impurity.

7. The non-volatile memory device of claim 1, wherein each of the columnar cell channels is formed to partially fill the corresponding cell channel hole so that each of the columnar cell channels includes a penetrating hole therein.

8. A non-volatile memory device comprising:
a pair of columnar cell channels vertically extending from a substrate;
a doped pipe channel arranged to couple lower ends of the pair of columnar cell channels;
memory layers arranged to surround side surfaces of the columnar cell channels;
control gate electrodes arranged to surround the side surfaces of the memory layers; and
a slit arranged to tunnel through an upper end of the doped pipe channel.

9. The non-volatile memory device of claim 8, further comprising insulation layers over the substrate in which the doped pipe channel is buried.

* * * * *